United States Patent
Ohmori et al.

(10) Patent No.: US 7,274,134 B2
(45) Date of Patent: Sep. 25, 2007

(54) PIEZOELECTRIC/ELECTROSTRICTIVE STRUCTURE AND METHOD FOR MANUFACTURING THE SAME

(75) Inventors: Makoto Ohmori, Nagoya (JP); Koji Kimura, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 125 days.

(21) Appl. No.: 11/138,250

(22) Filed: May 26, 2005

(65) Prior Publication Data

US 2005/0264138 A1 Dec. 1, 2005

(30) Foreign Application Priority Data

May 28, 2004 (JP) ............................. 2004-159779
Apr. 13, 2005 (JP) ............................. 2005-115428

(51) Int. Cl.
*H01L 41/083* (2006.01)
(52) U.S. Cl. ...................... 310/366; 310/340; 310/367
(58) Field of Classification Search ............... 310/328, 310/366, 340, 367
See application file for complete search history.

(56) References Cited

U.S. PATENT DOCUMENTS

| | | | | |
|---|---|---|---|---|
| 5,237,239 | A * | 8/1993 | Inoue et al. ................. | 310/328 |
| 5,607,535 | A * | 3/1997 | Tsukada et al. ............. | 156/252 |
| 6,106,106 | A | 8/2000 | Nakazawa et al. | |
| 6,502,302 | B2 | 1/2003 | Takeuchi et al. ............ | 791/129 |
| 6,637,102 | B2 | 10/2003 | Takeuchi et al. ...... | 791/129 CIP |
| 6,700,306 | B2 * | 3/2004 | Nakamura et al. .......... | 310/328 |
| 6,731,050 | B2 * | 5/2004 | Bindig et al. ............... | 310/366 |
| 7,061,162 | B2 * | 6/2006 | Sato et al. ................... | 310/328 |
| 7,148,607 | B2 * | 12/2006 | Sato ........................... | 310/334 |
| 2005/0168106 | A1 * | 8/2005 | Iwase et al. ................ | 310/328 |
| 2006/0066178 | A1 * | 3/2006 | Lindner et al. ............. | 310/328 |
| 2006/0279173 | A1 * | 12/2006 | Kimura et al. ............. | 310/328 |

FOREIGN PATENT DOCUMENTS

| | | | | |
|---|---|---|---|---|
| DE | JP-2002-280630 | * | 9/2002 | |
| JP | 2-285685 | * | 11/1990 | ................. 310/311 |
| JP | 3-9580 | * | 1/1991 | ................. 310/328 |
| JP | 3217006 B2 | | 8/2001 | |
| JP | 2002-160195 A1 | | 6/2002 | |
| JP | 2003-243738 | * | 8/2003 | |

OTHER PUBLICATIONS

U.S. Appl. No. 11/444,628, filed Jun. 1, 2006, Kimura et al.

* cited by examiner

*Primary Examiner*—Thomas M. Dougherty
(74) *Attorney, Agent, or Firm*—Burr & Brown

(57) ABSTRACT

A piezoelectric/electrostrictive structure is provided, including a plurality of stacked sheet-shaped piezoelectric/electrostrictive bodies and at least one sheet of a thin film. The interfaces between the piezoelectric/electrostrictive bodies are exposed at side faces of the piezoelectric/electrostrictive structure, the side faces have notches, and the thin film is placed on the notched portions of side faces. A method for manufacturing the piezoelectric/electrostrictive structure includes the steps of stacking a plurality of ceramic green sheets made of a piezoelectric/electrostrictive material, firing the stacked ceramic green sheets to prepare fired piezoelectric/electrostrictive bodies and forming at least one sheet of a thin film on side faces of the fired piezoelectric/electrostrictive bodies by a chemical vapor deposition process.

16 Claims, 11 Drawing Sheets

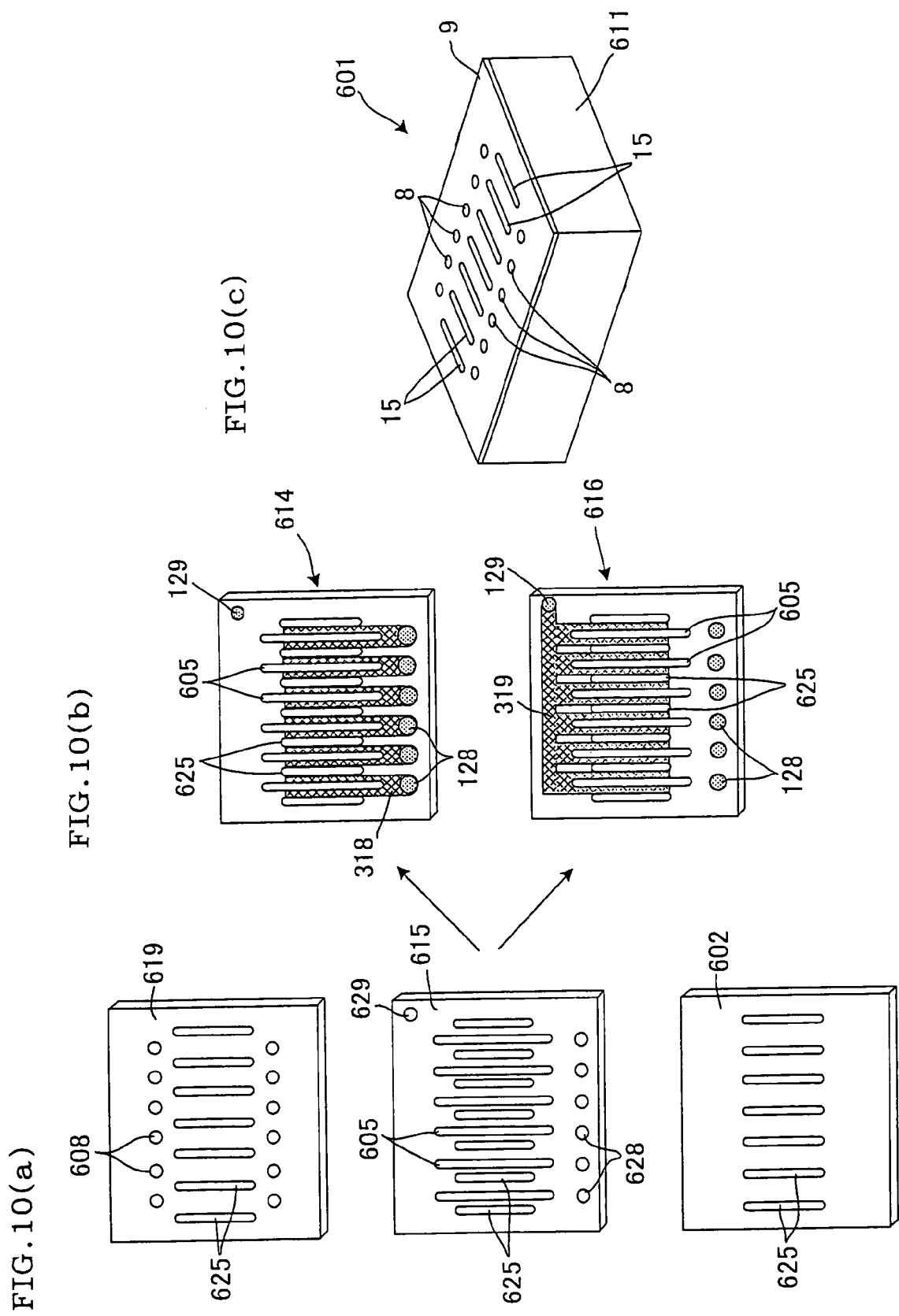

FIG. 15
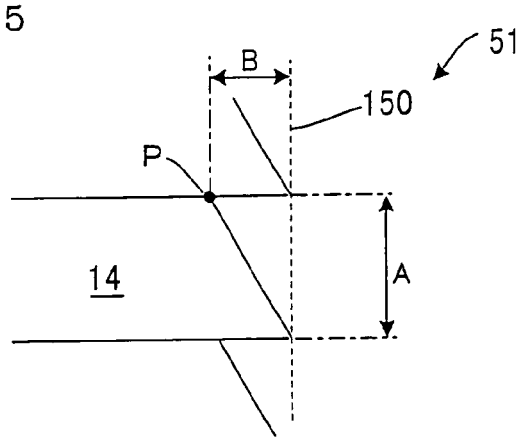
FIG. 16(a)
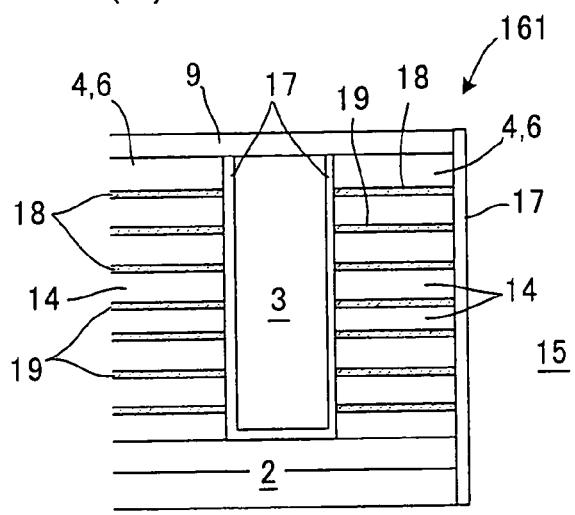
FIG. 16(b)
FIG. 16(c)
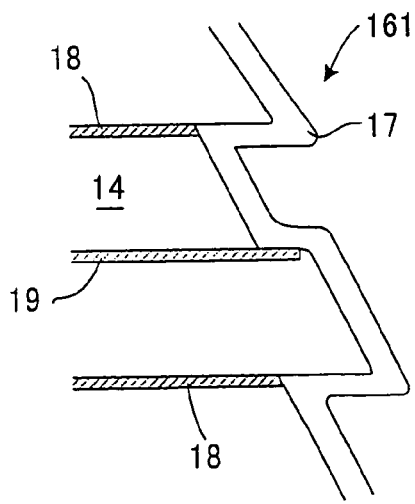

US 7,274,134 B2

PIEZOELECTRIC/ELECTROSTRICTIVE STRUCTURE AND METHOD FOR MANUFACTURING THE SAME

BACKGROUND OF THE INVENTION

1. Field of the Invention

The present invention relates to a piezoelectric/electrostrictive structure including a plurality of stacked sheet-shaped piezoelectric/electrostrictive bodies and also relates to a method for manufacturing such a structure by a green sheet-stacking process and a chemical vapor deposition (CVD) process.

2. Description of the Related Art

Printing apparatuses such as printers, facsimiles, and copiers have long used a non-impact process. In particular, most compact printers have recently used such a non-impact process; hence, clear images equivalent to silver photographs can be reproduced on sheets of paper with high-performance inkjet heads. Piezoelectric inkjet heads are typical components of non-impact printing apparatuses. The piezoelectric inkjet heads include actuators including a plurality of piezoelectric/electrostrictive actuating parts and discharge ink using the displacement of the piezoelectric/electrostrictive actuating parts.

FIG. 13 is a perspective view showing an exemplary inkjet head 130. The inkjet head 130 includes a nozzle plate 139 having nozzles 138 and also includes an actuator 131 having ink chambers 135 blocked with the nozzle plate 139. The ink chambers 135, which may be referred to as cells 133, are defined by partitions 136, a substrate 132, and a cover plate 137 and communicatively connected to ink supply channels, which are not shown. The partitions 136 form piezoelectric/electrostrictive actuating parts 134. In the inkjet head 130, the volume of the ink chambers 135 (the cells 133) is varied by applying driving voltages to the piezoelectric/electrostrictive actuating parts 134 (the partitions 136) and ink is therefore discharged from the nozzles 138, whereby printing is performed. Japanese Patent No. 3217006 (hereinafter referred to as Patent Document 1) discloses an inkjet head including an actuator.

There is no limit to the improvement of printing apparatuses for providing clear images. Therefore, for the inkjet head 130, the piezoelectric/electrostrictive actuating parts 134 and the ink chambers 135 need to be more densely arranged. In particular, the ink chambers 135 need to be arranged at 180 dots per inch (dpi) or more. In this case, the pitch between the nozzles 138 is equal to 141 μm (25.4 mm (one inch) per 180 of the nozzles 138). A decrease in the pitch between the nozzles 138 leads to a decrease in the width W of the ink chambers 135 and a decrease in the thickness T of the piezoelectric/electrostrictive actuating parts 134, as is clear from FIG. 13. Therefore, in order not to reduce the volume of the ink chambers 135, the depth (height) D of the ink chambers 135 must be increased by an amount equal to the decrement of the width W thereof. In usual, the depth D thereof is uniform and equal to the height of the piezoelectric/electrostrictive actuating parts 134. The dense arrangement of the piezoelectric/electrostrictive actuating parts 134 and the ink chambers 135 leads to an increase in the aspect ratio D/T of the piezoelectric/electrostrictive actuating parts 134 and an increase in the aspect ratio D/W of the ink chambers 135. The volume of the ink chambers 135 can be maintained by increasing the length of the ink chambers 135 without increasing the width W thereof. However, this technique is not preferable because the area of the actuator 131 is increased.

The actuator 131 having the above configuration can be manufactured by firing a green compact prepared by a green sheet-stacking process. FIGS. 14A to 14C are illustrations showing steps of manufacturing the actuator 131.

Slurry is prepared by mixing a piezoelectric material, a binder, a solvent, a dispersing agent, and an additive such as a plasticizer. Green sheets 16 are then prepared by a doctor blade process or another process using the slurry. The green sheets 16 are punched so as to have a predetermined shape. As shown in FIGS. 14A and the 14B, the resulting green sheets 16 are stacked on the substrate 132 and then pressed, whereby a ceramic green compact 143 is obtained. The ceramic green compact 143 obtained is fired, polarized as needed, wired, and then attached to the cover plate 137, whereby the actuator 131 shown in FIG. 14(c) is obtained. Electrodes may be attached to the actuator 131 as needed.

The actuator 131 prepared by the green sheet-stacking process has a problem in that the interfaces between the green sheets 16 are damaged in some cases when the ceramic green compact 143 is fired. The reason why the damage occurs will now be described with reference to FIGS. 2 and 3.

FIG. 2 is a sectional view showing section A of the ceramic green compact 143 shown in FIG. 14(b). Section A covers some of the piezoelectric/electrostrictive actuating parts 134 and the ink chambers 135. FIG. 3 is an enlarged sectional view showing a part of section A shown in FIG. 2. Each punched green sheet 16 has tapered end faces as disclosed in JP-A-2002-160195 (hereinafter referred to as Patent Document 2). Side faces of the ceramic green compact 143 that are vertical as shown in FIGS. 2 and 3 have notches 25 due to the stacked green sheets 16. With reference to FIG. 3, the stacked green sheets 16 can be displaced as disclosed in Patent Document 2. Therefore, after a pressure P is applied to the stacked green sheets 16 such that the green sheets 16 are unified, the interfaces between the green sheets 16 have unbonded portions 32 created due to a difference in depth between the notches 25. In the actuator 131 prepared by firing the ceramic green compact 143, cracks extend from the unbonded portions 32. Furthermore, since electrode layers are arranged on side faces of the actuator 131 that have the notches 25 and the piezoelectric/electrostrictive actuating parts 134 are distorted by applying voltages between the electrode layers, the actuator 131 is damaged by the cracks and the stress due to the displacement. In particular, actuators prepared by firing green compacts including green sheets and electrode layers placed therebetween have ceramic/metal interfaces and the bonding force between such interfaces is less than that of ceramic/ceramic interfaces. Therefore, such actuators are readily damaged.

An increase in the aspect ratio of the piezoelectric/electrostrictive actuating parts 134 makes such a problem more serious. This is because an excessive increase in pressure applied to the stacked green sheets 16 causes the stacked green sheets 16 to be buckled. Since the buckling strength is inversely proportional to the second power of the height of the piezoelectric/electrostrictive actuating parts 134, an increase in the aspect ratio of the piezoelectric/electrostrictive actuating parts 134 leads to a reduction in buckling strength. Therefore, the pressure applied to the green sheets 16 to be unified must be low. This causes unbonded portions to be created between the green sheets 16 which are not displaced. An increase in the aspect ratio of the piezoelectric/electrostrictive actuating parts 14, that is, a decrease in the width thereof enhances the influence of the unbonded portions on the strength; hence, the actuator 131 is readily damaged. The damage of the actuator 131 leads to the leakage of ink from ink chambers 135 placed in the inkjet head 130 and therefore leads to a serious decline in the reliability of printing apparatuses.

SUMMARY OF THE INVENTION

The present invention has been made to solve the above problem. It is an object of the present invention to provide a high-reliability inkjet head which is compatible with current high-resolution printing apparatuses and which includes ink chambers arranged at high density. The inventors have performed investigations and found that the above object can be achieved in such a manner that dense thin films are provided on side faces of a compact prepared by stacking green sheets, the interfaces between the green sheets being exposed at the side faces, whereby unbonded portions from which cracks extend are covered with the thin films and securely bonded to each other. Hence, the strength of the compact is therefore enhanced. In particular, the object can be achieved by providing a piezoelectric/electrostrictive structure functioning as an actuator. It is another object of the present invention to provide a method for manufacturing such a piezoelectric/electrostrictive structure These objects can be achieved as described below.

The present invention provides a piezoelectric/electrostrictive structure including a plurality of stacked sheet-shaped piezoelectric/electrostrictive bodies and at least one sheet of a thin film. The interfaces between the piezoelectric/electrostrictive bodies are exposed at side faces of the piezoelectric/electrostrictive structure. The side faces have notches. The thin films are placed on the notched portions of side faces. This structure is hereinafter referred to as a first piezoelectric/electrostrictive structure.

In the first piezoelectric/electrostrictive structure, the at least one sheet of a thin film preferably includes at least one film selected from the group consisting of a barrier film, an electrode film, an insulating film, a protective film, and a moisture-proof film and have a single-layered or multilayered structure. It is preferable that the barrier film is made of an oxide or a nitride, the electrode film being made of a metal or an oxide, and the insulating film, the protective film, and the moisture-proof film being made of an oxide, a nitride, or a carbide.

In the first piezoelectric/electrostrictive structure, the at least one sheet of a thin film preferably includes a barrier film and an electrode film that are placed on each end face of the piezoelectric/electrostrictive bodies in that order on the surface of piezoelectric/electrostrictive bodies.

The present invention provides a piezoelectric/electrostrictive structure including a plurality of stacked sheet-shaped piezoelectric/electrostrictive bodies and at least one sheet of a thin film. The interfaces between the piezoelectric/electrostrictive bodies are exposed at side faces of the piezoelectric/electrostrictive structure. The side faces have notches. The at least one sheet of a thin film is placed on the notched portions of side faces, and includes at least one film selected from the group consisting of an insulating film, a protective film, and a moisture-proof film, has a single-layered or multilayered structure, and has a thermal expansion coefficient less than that of the piezoelectric/electrostrictive bodies. This piezoelectric/electrostrictive structure is hereinafter referred to as a second piezoelectric/electrostrictive structure.

In the second piezoelectric/electrostrictive structure, the insulating film, the protective film, and the moisture-proof film is preferably made of an oxide, a nitride, or a carbide.

In the second piezoelectric/electrostrictive structure, the at least one sheet of a thin film preferably has a thermal expansion coefficient that is 0.3 to 0.9 times the thermal expansion coefficient of the piezoelectric/electrostrictive bodies.

In the second piezoelectric/electrostrictive structure, the ratio of the thermal expansion coefficient of the thin films to that of the piezoelectric/electrostrictive bodies is preferably 0.3:1 to 0.9:1. The ratio is more preferably 0.35:1 to 0.85:1 and further more preferably 0.4:1 to 0.8:1. Since the at least one sheet of a thin film may include at least one film selected from the group consisting of the insulating film, the protective film, and the moisture-proof film, the term "the thermal expansion coefficient of the thin films" covers all of the thermal expansion coefficients of the insulating film, the protective film, and the moisture-proof film. The expression "at least one sheet of a thin film has a thermal expansion coefficient that is 0.3 to 0.9 times the thermal expansion coefficient of the piezoelectric/electrostrictive bodies" means that all of the insulating film, the protective film, and the moisture-proof film have such a thermal expansion coefficient. The term "the thermal expansion coefficient of the piezoelectric/electrostrictive bodies" means the thermal expansion coefficient of a piezoelectric/electrostrictive material for forming the piezoelectric/electrostrictive bodies.

In the second piezoelectric/electrostrictive structure, it is preferable that at least one sheet of a thin film includes an electrode film placed on each end face of the piezoelectric/electrostrictive bodies, and at least one film selected from the group consisting of the insulating film, the protective film, and the moisture-proof film may be placed on the electrode film.

In the second piezoelectric/electrostrictive structure, it is preferable that the at least one sheet of a thin film may include a barrier film placed on each end face of the piezoelectric/electrostrictive bodies and the electrode film is placed on the barrier film.

The first and second piezoelectric/electrostrictive structures (those may be simply referred to as the piezoelectric/electrostrictive structures of the present invention) may include electrode layers each placed between the stacked piezoelectric/electrostrictive bodies.

In the piezoelectric/electrostrictive structures of the present invention, the term "notches" means empty spaces formed by removing portions of the piezoelectric/electrostrictive structure.

Although the shape of the notches is not particularly limited, the notches preferably have substantially a triangular shape in cross section. It is more preferable that the bottoms of the notches have an acute angle when the notches have such a triangular shape. The term "the bottoms of the notches" means portions of the notches, the portions being most apart from the tops of the side faces of the piezoelectric/electrostrictive structures. The term "a shape in cross section" means a shape in cross section perpendicular to the direction in which the piezoelectric/electrostrictive bodies are stacked. Although there are various shapes in cross section, substantially a triangular shape in cross section is preferable. The term "the tops of the side faces of the piezoelectric/electrostrictive structures" means the surfaces of side faces of piezoelectric/electrostrictive structures having no notches.

The notches preferably have a width of 300 μm or less. Although the width of the notches is not particularly limited, the notches need to have a width of 5 μm or more.

The notches preferably have a depth of 3 to 50 μm.

The width of the notches is defined as the diameter of a circle inscribed in a triangle defined by the profile lines of each notch present at the side faces of the piezoelectric/electrostrictive structures. The depth of the notches is defined as the distance between the tops of the side faces of the piezoelectric/electrostrictive structures and the bottoms of the notches, that is, the distance between the tops of the side faces of the piezoelectric/electrostrictive structures and portions of the notches, the portions being most apart from the tops of the side faces of the piezoelectric/electrostrictive structures.

In the piezoelectric/electrostrictive structures of the present invention, the notches are not accidentally present due to defects formed in manufacturing steps but have been intentionally formed. The notches are preferably present at all of side faces of the piezoelectric/electrostrictive structures, the interfaces between the piezoelectric/electrostrictive bodies being exposed at the side faces.

In the piezoelectric/electrostrictive structures of the present invention, the expression "the at least one sheet of a thin film is placed on the notched portions of side faces" means that the at least one sheet of a thin film is placed on the side faces, which have shapes defined by the notches formed, in such a manner that the resultant surface after the formation of the at least one sheet of a thin film still retained the shape defined by the notched portions on side faces. That is, the at least one sheet of a thin film is so thin that the film thus formed can not fill completely the gaps defined by notches formed to make the surface of the side faces straight.

In the piezoelectric/electrostrictive structures of the present invention, the aspect ratio is preferably five to 100. The aspect ratio is more preferably seven to 100 and further more preferably ten to 100. The aspect ratio of a piezoelectric/electrostrictive structure is defined as the ratio of the height to the lateral width of the piezoelectric/electrostrictive structure, that is, the height/lateral width ratio.

The present invention provides a piezoelectric/electrostrictive actuator including a plurality of cells each defined by a cover plate, a bottom plate, and a pair of partitions connected to the cover plate and the bottom plate. The partitions each include any one of the piezoelectric/electrostrictive structures described above and the volume of the cells is varied by distorting the piezoelectric/electrostrictive structure. The piezoelectric/electrostrictive structure preferably has such an aspect ratio as described above; that is, the piezoelectric/electrostrictive structure is preferably tall. In an inkjet head including the piezoelectric/electrostrictive actuator, a pair of the partitions form each piezoelectric/electrostrictive actuating part and each cell placed between the partitions functions as an ink chamber; hence, the piezoelectric/electrostrictive actuating parts and the ink chambers are densely arranged. Such an inkjet head is suitable for current printing apparatuses for forming clear images.

The present invention provides a method for manufacturing a piezoelectric/electrostrictive structure. The method includes a step of stacking a plurality of ceramic green sheets made of a piezoelectric/electrostrictive material and firing the stacked ceramic green sheets to prepare a fired piezoelectric/electrostrictive body and a step of forming at least one sheet of a thin film on side faces of the fired piezoelectric/electrostrictive body by a chemical vapor deposition process, the interfaces between the sheets are exposed at the side faces. The ceramic green sheets may be herein simply referred to as green sheets.

In the method, the at least one sheet of a thin film is preferably formed at 150° C. to 850° C. The thin film is more preferably formed at 180° C. to 800° C. and further more preferably formed at 200° C. to 750° C.

In the method, the at least one sheet of a thin film is preferably formed under deposition pressure of from 0.1 to 20,000 Pa. The at least one of a thin film is more preferably formed under deposition pressure of from 0.2 to 18,000 Pa., and further more preferably formed under deposition pressure of from 0.3 to 15,000 Pa.

In the method, the at least one of a thin film preferably includes at least one selected from the group consisting of a barrier film, an electrode film, an insulating film, a protective film, and a moisture-proof film and has a single-layered or multilayered structure.

In the method, the at least one of a thin film preferably includes at least one film selected from the group consisting of an insulating film, a protective film, and a moisture-proof film and is preferably formed using an alkoxide organometallic compound or a β-diketone organometallic compound.

The term "piezoelectric/electrostrictive structure" used herein is not limited to structures using the piezoelectric effect (vertical or horizontal effect) of creating a strain substantially proportional to an applied electric field or the electrostrictive effect of creating a strain substantially proportional to the third power of an applied electric field but means a structure using a strain created due to an electric field. The term "piezoelectric/electrostrictive structure" covers structures using a phenomenon such as polarization reversal occurring in ferroelectric materials or antiferroelectric or ferroelectric transition occurring in antiferroelectric materials. Whether polarization is performed is determined depending on properties of the piezoelectric/electrostrictive bodies included in one of the piezoelectric/electrostrictive structures of the present invention.

The term "piezoelectric/electrostrictive body" used herein means a fired body principally containing a piezoelectric/electrostrictive material. In the present invention the piezoelectric/electrostrictive bodies included in a piezoelectric/electrostrictive structure have a sheet shape. A plurality of such piezoelectric/electrostrictive bodies are stacked and the number of the piezoelectric/electrostrictive bodies is not particularly limited. In order to achieve a high-performance actuator greatly distorted with low voltage, it is preferable that the piezoelectric/electrostrictive bodies are thin and that the number of the piezoelectric/electrostrictive bodies is large.

In the accompanying drawings, in order to promote a better understanding of the present invention, the interfaces between stacked sheet-shaped piezoelectric/electrostrictive bodies are represented by solid lines regardless of whether the bodies are green or fired. Since the bodies are formed by firing the green sheets and unified during, the interfaces between the bodies can be actually observed.

In the accompanying drawings, in order to promote a better understanding on the present invention, the interfaces between stacked sheet-shaped piezoelectric/electrostrictive bodies are represented by solid lines regardless of whether the bodies are green or fired. Since the bodies are formed by firing the green sheets and unified during, the interfaces between the bodies can be actually observed.

Since the side faces of the first or second piezoelectric/electrostrictive structure of the present invention have the thin films placed on, the structure has high strength. Therefore, even if the piezoelectric/electrostrictive bodies are displaced and unbonded portions are thereby created between the piezoelectric/electrostrictive bodies, no cracks due to the unbonded portions are formed; hence, the piezoelectric/electrostrictive structures have high long-term reliability.

Since the side faces of the first or second piezoelectric/electrostrictive structure have the notches, the residual stresses in the fired piezoelectric/electrostrictive bodies are small. The thin films, unlike films formed by a coating process, do not have such a large thickness enough to fill gaps formed by the notches to make the surfaces flat. In contrast, the thin films have a small thickness and therefore retain surfaces substantially identical to the side faces defined by the notches formed. Therefore, the stresses applied to the interfaces between the piezoelectric/electrostrictive bodies are small; hence, cracks are hardly formed and the piezoelectric/electrostrictive structure can attain extremely long-term reliability.

This is characteristic of the first and second piezoelectric/electrostrictive structures because the structures have been prepared by firing the stacked green sheets between which the electrode layers are each placed and therefore include the piezoelectric/electrostrictive bodies and the electrode layers each placed therebetween. In the structures, the piezoelectric/electrostrictive bodies are made of ceramic and the electrode layers are made of metal. In general, the bonding force between a ceramic layer and a metal layer is less than the bonding force between ceramic layers; hence, the interface between the ceramic layer and the metal layer is readily damaged. However, according to the piezoelectric/electrostrictive structures of the present invention, the thin films are placed on the side faces of the structures, the interfaces between the piezoelectric/electrostrictive bodies and the electrode layers are prevented from being damaged.

The first or second piezoelectric/electrostrictive structure of the present invention is preferably manufactured by the method of the present invention. According to the method of the present invention, the interfaces between the piezoelectric/electrostrictive bodies prepared by the green sheet-stacking process are exposed at side faces of the piezoelectric/electrostrictive structure, the side faces have the notches, and the thin films are formed on the side faces by the CVD process. Therefore, the interfaces therebetween are securely protected with the thin films and the piezoelectric/electrostrictive structure has high strength. The thickness of the thin films is so thin that the gaps defined by the notches formed are not filled in such an extent that the surfaces are made flat by formed films. Thus, the stresses applied to the interfaces therebetween are reduced; hence, the above advantages of the piezoelectric/electrostrictive structure can be attained.

In the first or second piezoelectric/electrostrictive structure of the present invention, when the thin films includes the electrode films, the barrier films for preventing diffusion are placed under the electrode films. According to this configuration, if the insulating films, the protective films, and/or the water-proof films are formed on the electrode films, a component of the electrode films is prevented from being diffused in the piezoelectric/electrostrictive bodies and/or a component of the piezoelectric/electrostrictive bodies is prevented from being diffused in the electrode films. Therefore, properties of the piezoelectric/electrostrictive bodies can be prevented from being deteriorated.

In the second piezoelectric/electrostrictive structure, the thin films including the insulating films, the protective films, and/or the water-proof films have a thermal expansion coefficient less than that of the piezoelectric/electrostrictive bodies; hence, compressive stresses remain in the thin films and tensile stresses remain in the piezoelectric/electrostrictive bodies because of the difference in thermal expansion coefficient between the thin films and the piezoelectric/electrostrictive bodies. In general, ceramic piezoelectric/electrostrictive materials have low tensile strength but high compressive strength. Since such compressive stresses remain in the thin films, the thin films are hardly damaged.

On the other hand, when the direction in which the tensile stresses are applied to the piezoelectric/electrostrictive bodies is microscopically observed, the observation shows that the tensile stresses are not applied perpendicularly to the interfaces between the piezoelectric/electrostrictive bodies but are applied obliquely to the piezoelectric/electrostrictive bodies because the side faces of the piezoelectric/electrostrictive structure have the notches. Therefore, the piezoelectric/electrostrictive structure has high durability. When the piezoelectric/electrostrictive structure is used as an actuator, distortable parts (piezoelectric/electrostrictive actuating parts) of the piezoelectric/electrostrictive structure can be readily distorted because the thin films have a small thickness and the force of the thin films against the displacement is quite small, that is, the thin films can minimize a force for preventing the displacement. Therefore, the piezoelectric/electrostrictive structure is suitable for inkjet heads that need to have a large force for discharging ink.

Since the first and second piezoelectric/electrostrictive structures have the above advantages, the reliability of the structures is not deteriorated if the aspect ratio thereof is increased. Since an increase in aspect ratio leads to a decrease in buckling strength, a large pressure cannot be used when the structures are prepared. However, the structures obtained have high strength and are hardly damaged.

When the first or second piezoelectric/electrostrictive structure having a large aspect ratio is used to prepare partitions (piezoelectric/electrostrictive actuating parts) forming actuators included in an inkjet head, the inkjet head has high reliability and can provide high-resolution images. This is because when the partitions have a large aspect ratio, the partitions and ink chambers (cells) can be densely arranged in the inkjet head without reducing the volume of the ink chambers and without causing an increase in component-mounting area.

The first or second piezoelectric/electrostrictive structure having a large aspect ratio can be greatly distorted with a constant voltage. When the piezoelectric/electrostrictive structure is used to prepare piezoelectric/electrostrictive actuating parts of actuators included in a liquid-discharging unit placed in a DNA microarrayer, the volume of cells (liquid chambers) can be greatly varied and a large amount of liquid can be discharged. In other words, this means that a desired amount of displacement (a desired amount of discharged liquid) can be achieved with low voltage. That is, an energy-efficient liquid-discharging unit can be prepared using the piezoelectric/electrostrictive structure. Since the piezoelectric/electrostrictive structure has a large aspect ratio, the structure is advantageous in achieving a good balance between displacement and generated force. Since a great change in volume can be achieved with a small force, high-viscosity liquid can be constantly discharged.

BRIEF DESCRIPTION OF THE DRAWINGS

FIGS. 10(a) to 10(c) are schematic views showing steps of manufacturing a piezoelectric/electrostrictive structure of the present invention.

FIG. 15 is a sectional view showing a piezoelectric/electrostrictive structure of the present invention and illustrates the depth and width of notches.

FIG. 16(a) is a sectional view showing a vertically stacked-type piezoelectric/electrostrictive structure according to another embodiment of the present invention.

FIG. 16(b) is a partly enlarged view showing a side face of the piezoelectric/electrostrictive structure shown in FIG. 16(a), including a plurality of sheet-shaped piezoelectric/electrostrictive bodies, the interfaces between the piezoelectric/electrostrictive bodies being exposed at the side face.

FIG. 16(c) is an enlarged sectional view showing a side face of a vertically stacked-type piezoelectric/electrostrictive structure according to another embodiment of the present invention, the structure including a plurality of stacked sheet-shaped piezoelectric/electrostrictive bodies, the interface between the piezoelectric/electrostrictive bodies being exposed at the side face.

DETAILED DESCRIPTION OF THE INVENTION

Piezoelectric/electrostrictive structures according to embodiments of the present invention and a method for manufacturing a piezoelectric/electrostrictive structure according to an embodiment of the present invention will now be described with reference to the accompanying drawings. It is to be understood that the present invention is not limited to the embodiments. Various modifications, variations, improvements, and replacements may be made based on the findings of those skilled in the art within the scope of the present invention. The accompanying drawings show preferable examples of the present invention. The present invention is not limited to the examples and information obtained from the drawings. In order to implement or verify the present invention, means identical or equivalent to those specified herein may be used and means described below are preferably used.

Figure 1A:
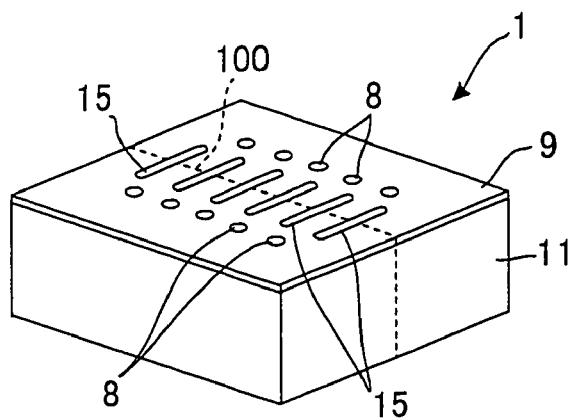
FIG. 1(a) is a perspective view showing an inkjet head including a piezoelectric/electrostrictive structure according to an embodiment of the present invention.
Figure 1B:
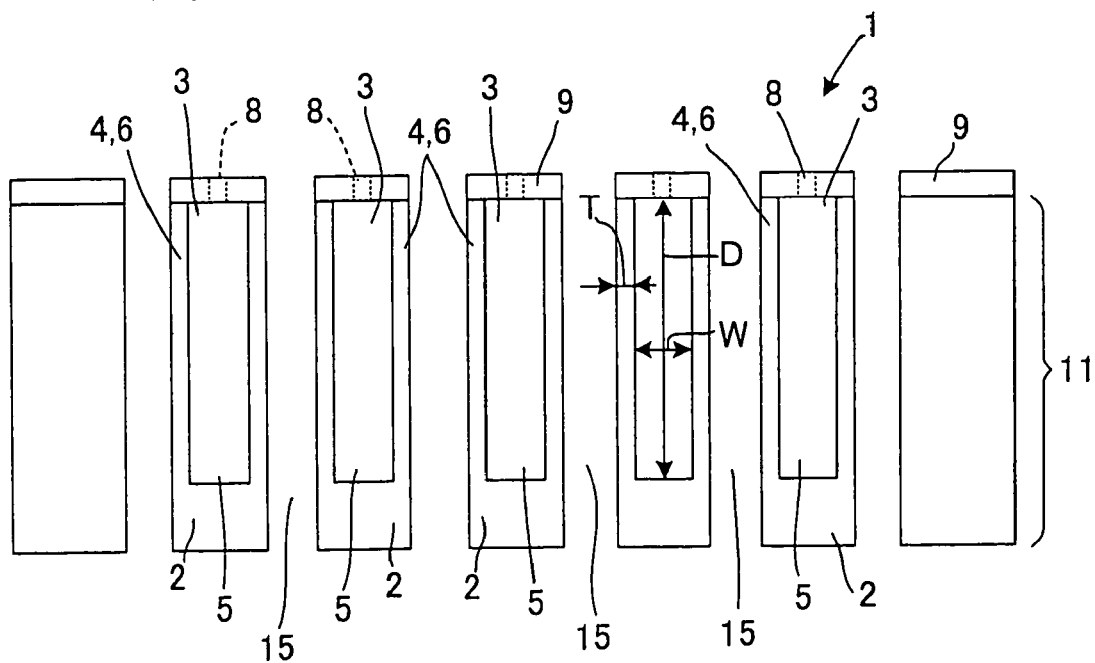
FIG. 1(b) is a sectional view showing the inkjet head taken along a line 100 shown in FIG. 1(a).
Figure 2:
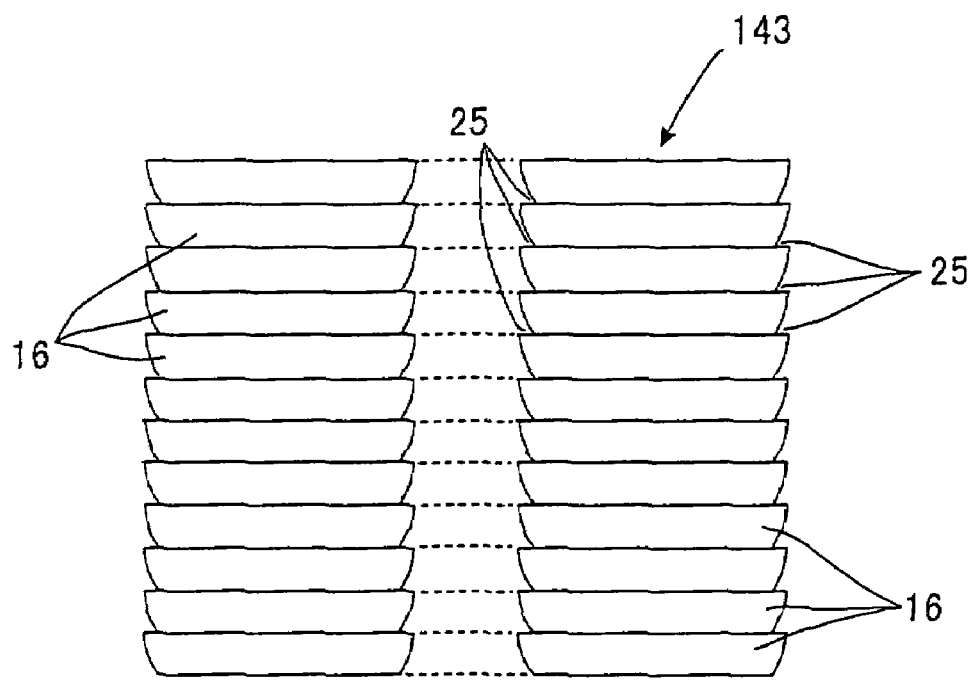
FIG. 2 is a sectional view showing section A of a ceramic green compact shown in FIG. 14(b).
Figure 3:
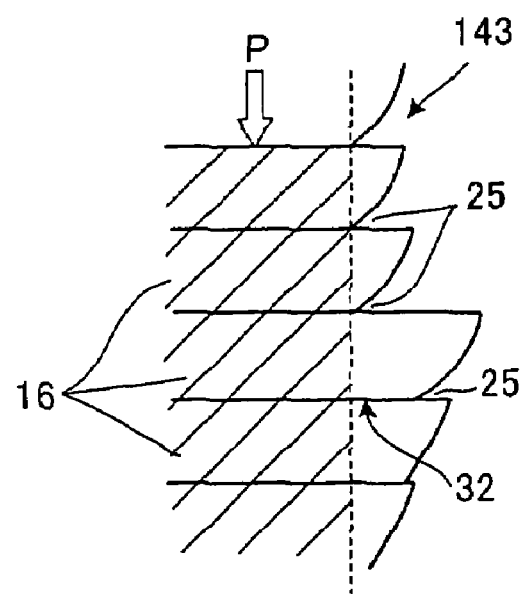
FIG. 3 is an enlarged sectional view showing a part of section A shown in FIG. 2.

A piezoelectric/electrostrictive structure according to an embodiment of the present invention will now be described. FIG. 1(a) is a perspective view showing an inkjet head 1 including the piezoelectric/electrostrictive structure. FIG. 1(b) is a sectional view showing the inkjet head 1 taken along a line 100 shown in FIG. 1(a). The inkjet head 1 includes an actuator 11 and a nozzle plate 9 having nozzles 8. The piezoelectric/electrostrictive structure corresponds to the actuator 11. The nozzle plate 9 and the actuator 11 may be unified into one.

The actuator 11 includes a plurality of cells 3 each defined by the nozzle plate 9 functioning as a cover plate, a bottom plate 2, and a pair of partitions 6 connected to the nozzle plate 9 and the bottom plate 2. The cells 3 have substantially a rectangular parallelepiped shape. A pair of the partitions 6 form each piezoelectric/electrostrictive actuating part 4. The volume of the cells 3 is varied by distorting the piezoelectric/electrostrictive actuating parts 4 (the partitions 6). Dummy cells 15 are each placed between the cells 3. In the inkjet head 1, the cells 3 are used as ink chambers 5 (pressurized liquid chambers) and liquid contained in the cells 3 can be discharged therefrom by vertically expanding or contracting the piezoelectric/electrostrictive actuating parts 4 (the partitions 6) to vary the volume of the cells 3.

The piezoelectric/electrostrictive structure is a multilayered body including a plurality of stacked sheet-shaped piezoelectric/electrostrictive bodies. Modifications of the piezoelectric/electrostrictive structure can be classified depending on how to arrange the piezoelectric/electrostrictive bodies, how to form electrodes for applying electric fields to the piezoelectric/electrostrictive actuating parts 4 to drive the piezoelectric/electrostrictive actuating parts 4, or the like. Examples of the piezoelectric/electrostrictive structure, which can be used as the actuator 11 of the inkjet head 1, are described below.

(1) Vertically Stacked Type

A vertically stacked-type piezoelectric/electrostrictive structure includes a plurality of vertically-stacked sheet-shaped piezoelectric/electrostrictive bodies. The direction in which the piezoelectric/electrostrictive bodies are stacked corresponds to the height direction of piezoelectric/electrostrictive actuating parts.

Figure 5A:
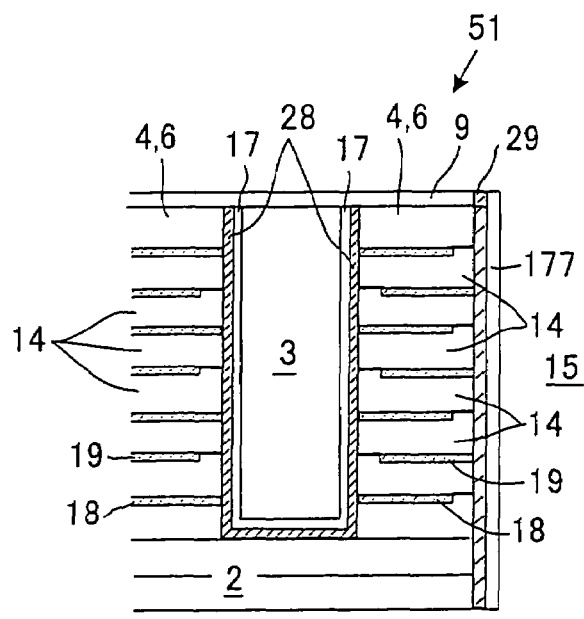
FIG. 5(a) is a sectional view showing a vertically stacked-type piezoelectric/electrostrictive structure according to an embodiment of the present invention.
Figure 5B:
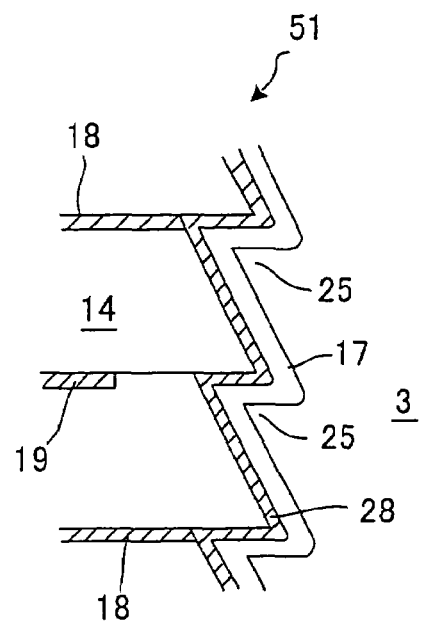
FIG. 5(b) is a partly enlarged view showing a side face of the piezoelectric/electrostrictive structure shown in FIG. 5(a), including a plurality of stacked sheet-shaped piezoelectric/electrostrictive bodies, the interfaces between the piezoelectric/electrostrictive bodies being exposed at the side face.

FIG. 5(a) is a sectional view showing a vertically stacked-type piezoelectric/electrostrictive structure 51 according to an embodiment of the present invention and is similar to FIG. 1(b). FIG. 5(b) is a partly enlarged view showing a side face of the piezoelectric/electrostrictive structure 51, shown in FIG. 5(a), including a plurality of vertically stacked sheet-shaped piezoelectric/electrostrictive bodies 14, the interfaces between the piezoelectric/electrostrictive bodies 14 being exposed at the side face. The piezoelectric/electrostrictive structure 51 includes partitions 6 which form piezoelectric/electrostrictive actuating parts 4 and in which first electrode layers 18 and second electrode layers 19 are each alternately placed between the piezoelectric/electrostrictive bodies 14. Cells 3 and dummy cells 15 are alternately arranged in the piezoelectric/electrostrictive structure 51 and separated from each other by the partitions 6. First electrode films 28 functioning as common electrodes are each placed on corresponding faces of the partitions 6 that face the cells 3 and second electrode films 29 functioning as individual electrodes are each placed on corresponding faces of the partitions 6 that face the dummy cells 15. One end of each first or second electrode layer 18 or 19 is placed between the piezoelectric/electrostrictive bodies 14 and the other end is exposed therefrom. The first electrode layers 18 are connected to the first electrode films 28 and the second electrode layers 19 are connected to the second electrode films 29. Protective films 17 are each placed on the corresponding first electrode films 28 facing the cells 3. Insulating films 177 are each placed on the corresponding second electrode films 29 facing the dummy cells 15. The protective films 17 protect the first electrode films 28 from, for example, a corrosive liquid contained in the cells 3. The insulating films 177 insulate the second electrode films 29. The following films may be used instead of the protective films 17 and the insulating films 177: a single-layered film containing a material having both protective properties and insulating properties.

The first and second electrode films 28 and/or 29 may be placed in the piezoelectric/electrostrictive bodies 14. In this case, the protective films 17 protect the first electrode layers 18 from, for example, a corrosive liquid contained in the cells 3 and the insulating films 177 insulate the second electrode layers 19. When the first and second electrode films 28 and 29 and the protective films 17 and the insulating films 177 are arranged as described above, barrier films (not shown) may be placed under the first and second electrode films 28 and 29.

With reference to FIG. 5(b), in the piezoelectric/electrostrictive structure 51, the interfaces between the piezoelectric/electrostrictive bodies 14 are exposed at side faces of the partitions 6 that face the cells 3 and the side faces have a plurality of notches 25 (not shown in FIG. 5(a)) and are uneven due to the notches 25. The first electrode films 28 and protective films 17 placed on the side faces in that order on the surface of piezoelectric/electrostrictive bodies have faces identical to the notched portions of side faces as shown in FIG. 5(b). The first electrode films 28 and the protective films 17 have a thickness less than the depth of the notches 25. Therefore, although the first electrode films 28 and protective films 17 cover the notches 25, the partitions 6 have no flat surfaces. This is characteristic of the piezoelectric/electrostrictive structure according to the present invention. Side faces of the partitions 6 that face the dummy cells 15 also have the notches 25 and are therefore uneven. The second electrode films 29 and the insulating films 177 lie on these side faces in that order on the surface of piezoelectric/electrostrictive bodies.

The depth and width of the notches 25 will now be described with reference to FIG. 15. FIG. 15 is a sectional view showing the piezoelectric/electrostrictive structure 51, the electrode layers and films being omitted in this figure. The width A of the notches 25 is substantially equal to the height of the piezoelectric/electrostrictive bodies 14, the width of the notches 25 being represented by symbol A in FIG. 15. The depth of the notches 25 is substantially equal to the distance between outer faces 150 of the piezoelectric/electrostrictive structure 51 and deepest portions P of the notches 25, the depth of the notches 25 being represented by symbol B.

Figure 11A:
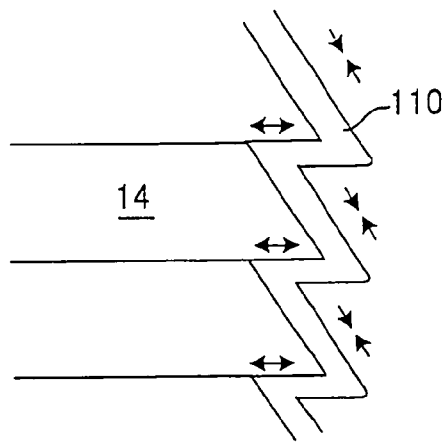
FIG. 11(a) is a partly enlarged view showing a side face of a piezoelectric/electrostrictive structure of the present invention, the piezoelectric/electrostrictive structure including sheet-shaped piezoelectric/electrostrictive bodies, the interfaces between the piezoelectric/electrostrictive bodies being exposed at the side face.
Figure 11B:
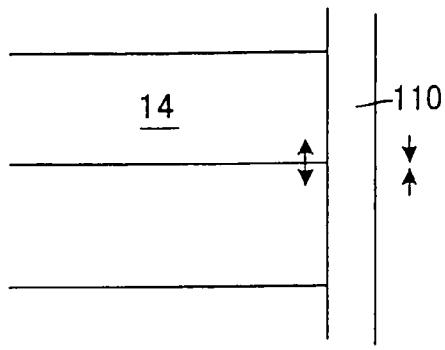
FIG. 11(b) is a partly enlarged view showing a side face of a piezoelectric/electrostrictive structure, the side face having no notches.

An advantage due to the notches 25 will now be described with reference to FIGS. 11(a) and 11(b). FIG. 11(a) is a partly enlarged view showing a side face of a piezoelectric/electrostrictive structure including a plurality of sheet-shaped piezoelectric/electrostrictive bodies, the interfaces between the piezoelectric/electrostrictive bodies 14 being exposed at the side face. The face has a plurality of notches 25 and a thin film 110 such as a protective film covers the notches 25. FIG. 11(b) is a partly enlarged view showing a side face of a piezoelectric/electrostrictive structure, the side face having no notches. The side face shown in FIG. 11(b) is identical to faces of piezoelectric/electrostrictive structures prepared by machining such as dicing.

In the piezoelectric/electrostrictive structure shown in FIG. 11(a), when the thin film 110 has a thermal expansion coefficient less than that of the piezoelectric/electrostrictive bodies 14, residual stresses are applied to the piezoelectric/electrostrictive structure in the direction indicated by the arrows shown in FIG. 11(a) because the notches 25 are present. The direction in which the residual stresses are applied form a certain angle with the interfaces between the piezoelectric/electrostrictive bodies 14; hence, the residual stresses are relatively small. Therefore, cracks can be prevented from being formed in the peripheries of the interfaces. In contrast, in the piezoelectric/electrostrictive structure of which the side face has no notches, residual stresses are applied to the piezoelectric/electrostrictive structure in the direction indicated by the arrows shown in FIG. 11(b); that is, the residual stresses are directly applied to the interfaces between the piezoelectric/electrostrictive bodies 14. Therefore, cracks are readily formed in the peripheries of the interfaces.

In the piezoelectric/electrostrictive structure 51 shown in FIG. 5(a) or 5(b), the partitions 6 each include eight of the piezoelectric/electrostrictive bodies 14. In the piezoelectric/electrostrictive structures according to the present invention, the number of the piezoelectric/electrostrictive bodies is determined depending on the uses and applications of the piezoelectric/electrostrictive structure and is preferably two to about 300.

In the piezoelectric/electrostrictive structure 51, the piezoelectric/electrostrictive bodies 14 are polarized, for example, in the direction from the first electrode layers 18 to the second electrode layers 19, that is, in the vertical direction of FIG. 5(a). The polarization directions of the piezoelectric/electrostrictive bodies 14 are different from each other depending on whether the piezoelectric/electrostrictive bodies 14 are placed on or under the first electrode layers 18. Electric fields of which the directions are the same as the polarization directions described above are created by applying voltages between the first electrode layers 18 and the second electrode layers 19 via the first electrode films 28 and the second electrode films 29, respectively, in such a manner that the first electrode layers 18 are positively charged and the second electrode layers 19 are negatively charged. In other words, the piezoelectric/electrostrictive bodies 14 have polarization directions opposite to each other and are alternately stacked in such a manner that each first or second electrode layer 18 or 19 is placed between the piezoelectric/electrostrictive bodies 14. In the piezoelectric/electrostrictive bodies 14, the polarization directions are the same as those of the electric fields. Therefore, strains due to the electric fields are created in the piezoelectric/electrostrictive bodies 14, which are expanded or contracted in substantially the vertical direction as shown in FIG. 5(*a*); that is, expanded or contracted perpendicularly to the bottom plate 2. Hence, the piezoelectric/electrostrictive actuating parts 4 are driven due to the vertical displacement. Since the displacement of the piezoelectric/electrostrictive bodies 14 is created directly using the strains due to the electric fields, the force created by the displacement is large and the response speed is high. Although the displacement of each piezoelectric/electrostrictive body 14 is not large, the displacement increases with an increase in the number of the piezoelectric/electrostrictive bodies 14; hence, the displacement can be greatly enhanced by increasing the number of the piezoelectric/electrostrictive bodies 14.

In the piezoelectric/electrostrictive structure 51, the piezoelectric/electrostrictive bodies 14 preferably have a thickness of 100 μm or less and more preferably 10 to 80 μm. In this case, the piezoelectric/electrostrictive structure 51 can be driven with low voltage.

The aspect ratio of the piezoelectric/electrostrictive structure 51 is determined for each region in which displacement occurs. The aspect ratio of the piezoelectric/electrostrictive structure 51 is equal to the ratio of the height of the partitions 6 that form each piezoelectric/electrostrictive actuating part 4 (a displacement-occurring region) to the width thereof. Since the piezoelectric/electrostrictive structure 51 shown in FIG. 5(*a*) corresponds to the actuator 11 shown in FIG. 1(*b*), FIG. 5(*a*) is a sectional view showing the piezoelectric/electrostrictive structure 51 taken along a line extending in the lateral direction of the piezoelectric/electrostrictive structure 51 and the aspect ratio of the piezoelectric/electrostrictive structure 51 is equal to the ratio of the height of the piezoelectric/electrostrictive actuating part 4 (the partitions 6) shown in FIG. 5(*a*) to the width thereof. With reference to FIG. 5(*a*), the piezoelectric/electrostrictive structure 51 has an aspect ratio of about three. The piezoelectric/electrostrictive structure according to the present invention preferably has an aspect ratio of five to 100. In the actuator 11 shown in FIG. 1(*b*), the partitions 6 (the piezoelectric/electrostrictive actuating parts 4) have an aspect ratio (D/T) of about 15, the aspect ratio being defined as the ratio of the height (corresponding to the depth D of the cells 3) of the partitions 6 to the thickness T thereof, or have an aspect ratio (D/W) of about five, the aspect ratio being defined as the ratio of the depth D of the cells 3 (corresponding to the height of the partitions 6) to the width W thereof.

Figure 6A:
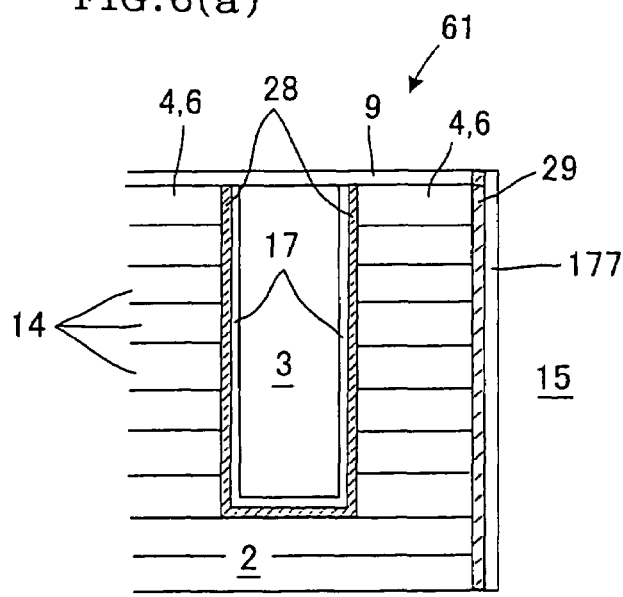
FIG. 6(a) is a sectional view showing a vertically stacked-type piezoelectric/electrostrictive structure according to another embodiment of the present invention.
Figure 6B:
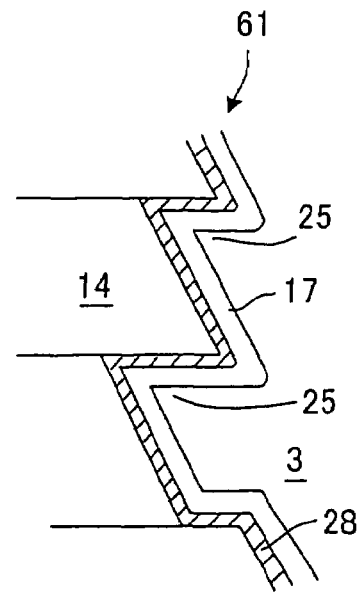
FIG. 6(b) is a partly enlarged view showing a side face of the piezoelectric/electrostrictive structure shown in FIG. 6(a), including a plurality of stacked sheet-shaped piezoelectric/electrostrictive bodies, the interfaces between the piezoelectric/electrostrictive bodies being exposed at the side face.

FIG. 6(*a*) is a sectional view showing a vertically stacked-type piezoelectric/electrostrictive structure 61 according to another embodiment of the present invention and is similar to FIG. 5(*a*). FIG. 6(*b*) is a partly enlarged view showing a side face of the piezoelectric/electrostrictive structure 61, shown in FIG. 6(*a*), including a plurality of vertically stacked sheet-shaped piezoelectric/electrostrictive bodies 14, the interfaces between the piezoelectric/electrostrictive bodies 14 being exposed at the side face. The piezoelectric/electrostrictive structure 61 includes partitions 6 which form piezoelectric/electrostrictive actuating parts 4 and in which first electrode layers 18 and second electrode layers 19 are each alternately placed between the piezoelectric/electrostrictive bodies 14. Cells 3 and dummy cells 15 are alternately arranged in the piezoelectric/electrostrictive structure 61 and separated from each other with the partitions 6. First electrode films 28 functioning as common electrodes are each placed on corresponding faces of the partitions 6 that face the cells 3 and second electrode films 29 are each placed on corresponding faces of the partitions 6 that face the dummy cells 15. No electrode layers are placed between the piezoelectric/electrostrictive bodies 14. Protective films 17 may be each placed on the corresponding first electrode films 28 and insulating films 177 may be each placed on the corresponding second electrode films 29 as needed. The protective films 17 protect the first electrode films 28 from, for example, a corrosive liquid contained in the cells 3. The insulating films 177 insulate the second electrode films 29. The following films may be used instead of the protective films 17 and the insulating films 177: A single-layered film containing a material having both protective properties and insulating properties. The partitions 6 may have barrier films (not shown) placed under the first electrode films 28 or the second electrode films 29.

With reference to FIG. 6(*b*), in the piezoelectric/electrostrictive structure 61, the interfaces between the piezoelectric/electrostrictive bodies 14 are exposed at side faces of the partitions 6 that face the cells 3 and the side faces have a plurality of notches 25, which are not shown in FIG. 6(*a*), and are uneven due to the notches 25. The first electrode films 28 and protective films 17 placed on the side faces in that order on the surface of piezoelectric/electrostrictive bodies have faces identical to the notched portions of side faces as shown in FIG. 6(*b*). The first electrode films 28 and the protective films 17 have a thickness less than the depth of the notches 25. Therefore, although the first electrode films 28 and protective films 17 cover the notches 25, the partitions 6 have no flat surfaces. This is characteristic of the piezoelectric/electrostrictive structure according to the present invention. Side faces of the partitions 6 that face the dummy cells 15 also have the notches 25 and are uneven. The second electrode films 29 and the insulating films 177 lie on these notched portions of side faces in that order on the surface of piezoelectric/electrostrictive bodies and have faces identical to the notched portions of side faces.

In the piezoelectric/electrostrictive structure 61, the piezoelectric/electrostrictive bodies 14 are polarized, for example, in the direction from the first electrode films 28 to the second electrode films 29, that is, in the horizontal direction of FIG. 6(*a*). Electric fields of which the directions are the same as the polarization directions described above are created by applying voltages between the first electrode films 28 and the second electrode films 29 in such a manner that the first electrode films 28 are positively charged and the second electrode films 29 are negatively charged. In other words, in the piezoelectric/electrostrictive structure 61, the polarization directions are the same as those of the electric fields. Therefore, strains due to the electric fields are created in the piezoelectric/electrostrictive bodies 14, which are expanded or contracted in substantially the vertical direction as shown in FIG. 6(a); that is, expanded or contracted perpendicularly to the bottom plate 2. Hence, the piezoelectric/electrostrictive actuating parts 4 are driven due to the vertical displacement. Since the displacement of the piezoelectric/electrostrictive bodies 14 is created directly using the strains due to the electric fields, the force created by the displacement is large and the response speed is high.

Figure 7A:
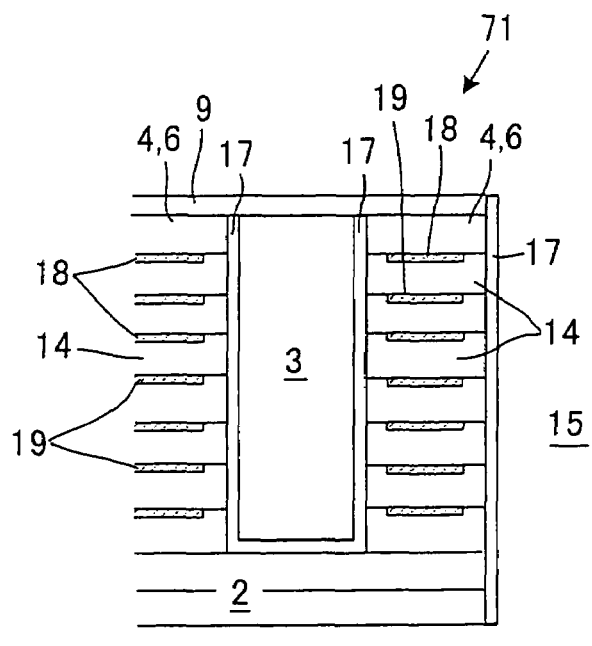
FIG. 7(a) is a sectional view showing a vertically stacked-type piezoelectric/electrostrictive structure according to another embodiment of the present invention.
Figure 7B:
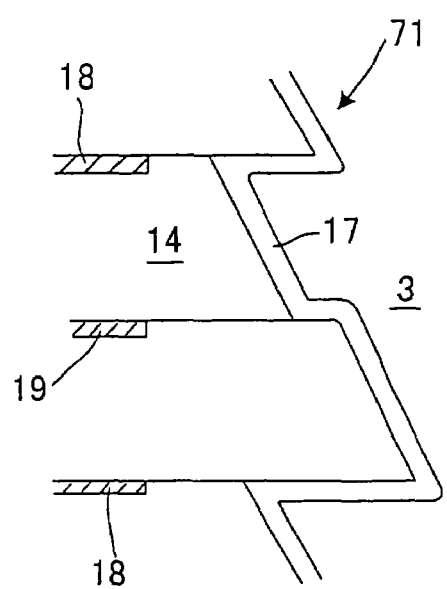
FIG. 7(b) is a partly enlarged view showing a side face of the piezoelectric/electrostrictive structure shown in FIG. 7(a), including a plurality of stacked sheet-shaped piezoelectric/electrostrictive bodies, the interfaces between the piezoelectric/electrostrictive bodies being exposed at the side face.

FIG. 7(a) is a sectional view showing a vertically stacked-type piezoelectric/electrostrictive structure 71 according to another embodiment of the present invention. FIG. 7(b) is a partly enlarged view showing a side face of the piezoelectric/electrostrictive structure 71, shown in FIG. 7(a), including a plurality of stacked sheet-shaped piezoelectric/electrostrictive bodies 14, the interfaces between the piezoelectric/electrostrictive bodies 14 being exposed at the side face. FIG. 16(a) is a sectional view showing a vertically stacked-type piezoelectric/electrostrictive structure 161 according to another embodiment of the present invention. FIG. 16(b) is a partly enlarged view showing a side face of the piezoelectric/electrostrictive structure 161, shown in FIG. 16(a), including a plurality of stacked sheet-shaped piezoelectric/electrostrictive bodies 14, the interfaces between the piezoelectric/electrostrictive bodies 14 being exposed at the side face.

The piezoelectric/electrostrictive structure 71 shown in FIG. 7(a) or 7(b) is similar to the piezoelectric/electrostrictive structure 51. The piezoelectric/electrostrictive bodies 14 are vertically stacked and first electrode layers 18 and second electrode layers 19 are each placed between the piezoelectric/electrostrictive bodies 14. Both end portions of each first or second electrode layer 18 or 19 are embedded between the piezoelectric/electrostrictive bodies 14. First electrode films 28 functioning as common electrodes or second electrode films 29 (not shown) are not placed on faces of partitions 6 that face cells 3 or dummy cells 15, respectively, but are arranged in the piezoelectric/electrostrictive structure 71. In particular, internal electrodes, placed in the piezoelectric/electrostrictive bodies 14, for driving piezoelectric/electrostrictive actuating parts 4 are connected to wires extending in through-holes or other holes arranged in the piezoelectric/electrostrictive structure 71 such that signals are applied to desired portions of the piezoelectric/electrostrictive structure 71. Although there is no possibility that a conductive liquid contained in the cells 3 makes contact with the first and second electrode layers 18 and 19, protective films 17 for protecting the piezoelectric/electrostrictive bodies 14 from the conductive liquid are placed on the partitions 6. Insulating films, moisture-proof films, or multilayered films including insulating films and moisture-proof films may be used instead of the protective films 17 depending on properties of liquid contained in the cells 3.

In contrast to the piezoelectric/electrostrictive structure 71 shown in FIG. 7(a), the piezoelectric/electrostrictive structure 161 shown in FIG. 16(a) or 16(b) preferably has a configuration in which first electrode layers 18 and second electrode layers 19 are not embedded between sheet-shaped piezoelectric/electrostrictive bodies 14 but end portions of the first and second electrode layers 18 and 19 are exposed from the piezoelectric/electrostrictive bodies 14, because the piezoelectric/electrostrictive structure 161 can be readily manufactured. Individual electrodes or common electrodes (driving electrodes) for applying voltages between the first electrode layers 18 and the second electrode layers 19 may be arranged in the piezoelectric/electrostrictive structure 161 such that the piezoelectric/electrostrictive structure 161 functions as an actuator. In the piezoelectric/electrostrictive structure 161, the first or second electrode layers 18 or 19 are each placed on the corresponding upper faces of the piezoelectric/electrostrictive bodies 14 as shown in FIG. 16(b). However, the first or second electrode layers 18 or 19 may each placed under the corresponding lower faces of the piezoelectric/electrostrictive bodies 14 as shown in FIG. 16(c). As is clear from the comparison between the configuration shown in FIG. 16(b) and the configuration shown in FIG. 16(c), the state of exposed end portions of the first or second electrode layers 18 or 19 placed on the upper faces of the piezoelectric/electrostrictive bodies 14 is different from the state of exposed end portions of the first or second electrode layers 18 or 19 placed under the lower faces thereof.

In the piezoelectric/electrostrictive structure 71, the interfaces between the piezoelectric/electrostrictive bodies 14 are exposed at side faces of the partitions 6 that face the cells 3 and the side faces each have a plurality of notches 25 (not shown in FIG. 7(a)) and are uneven due to the notches 25 as shown in FIG. 7(b). The protective films 17 lie on the notched portions of side faces and have faces identical to the notched portions of side faces. The protective films 17 have a thickness less than the depth of the notches 25. Therefore, although the protective films 17 cover the notches 25, the surface of the partitions 6 is not flat. This is characteristic of the piezoelectric/electrostrictive structure according to the present invention. Side faces of the partitions 6 that face the dummy cells 15, which are not shown, also have the notches 25 and are uneven and the protective films 17 lie on these notched portions of side faces in that order on the surface of piezoelectric/electrostrictive bodies and have faces identical to the notched portions of side faces.

The polarization and displacement of the piezoelectric/electrostrictive structure 71 and an electric field for driving the piezoelectric/electrostrictive structure 71 are the same as those of the piezoelectric/electrostrictive structure 51 and that for driving the piezoelectric/electrostrictive structure 51, respectively.

In order to create displacement, electrode layers preferably lies over sheet-shaped piezoelectric/electrostrictive bodies. That is, both end portions of each electrode layer are preferably exposed from sheet-shaped piezoelectric/electrostrictive bodies and insulated with insulating films as described about the piezoelectric/electrostrictive structure 161, which is more preferable than the piezoelectric/electrostrictive structure 71 in which both end portions of the first and second electrode layers 18 and 19 are embedded between the piezoelectric/electrostrictive bodies 14. Furthermore, as described above, in order to produce large displacement with low voltage, it is preferable that stacked sheet-shaped piezoelectric/electrostrictive bodies have a small thickness and the number of the piezoelectric/electrostrictive bodies be large. However, in this case, the number of exposed electrode layers per unit area is large; hence, in order to securely insulate the electrode layers, it is critical that the insulating films be free of cracks. This is because if the insulating films have cracks, the electrode layers are short-circuited due to a conductive liquid contained in cells and therefore fail to function.

A reduction in the thickness of the piezoelectric/electrostrictive bodies leads to a reduction in the distance between the electrode layers placed between the piezoelectric/electrostrictive bodies; hence, even fine cracks present in the insulating films causes a short circuit with high probability. Sheet-shaped piezoelectric/electrostrictive bodies with a thickness of 200 μm and those with a thickness of 10 μm are greatly different from each other in the frequency of occurrence of cracks formed in insulating films and in the size of the cracks, the crack frequency and the crack size having an influence on the durability. That is, an increase in displacement efficiency leads to a reduction in reliability; hence, crack-free insulating films are key components of the piezoelectric/electrostrictive structure.

In the piezoelectric/electrostrictive structure 61 using horizontal effects as described above, the partitions preferably have the protective films in addition to the electrode films or the insulating films. The partitions more preferably have films containing a material having both insulating properties and protective properties. This is because liquid contained in the cells is corrosive in some cases; hence, the electrode films can be corroded. In this case, since the reliability of the protective films for protecting the electrode films involves the durability, crack-free protective films are key components of the piezoelectric/electrostrictive structure. In those circumstances, the piezoelectric/electrostrictive structure according to the second embodiment of the present invention is appropriate for the above use, because the insulating films or the protective films are rendered crack-free by allowing the residual stresses in the insulating films or the protective films to act as a compressive stress.

(2) Horizontally Arranged Type

A horizontally arranged-type piezoelectric/electrostrictive structure includes a plurality of horizontally arranged sheet-shaped piezoelectric/electrostrictive bodies. The direction in which the piezoelectric/electrostrictive bodies are horizontally arranged corresponds to the width direction of piezoelectric/electrostrictive actuating parts.

Figure 8A:
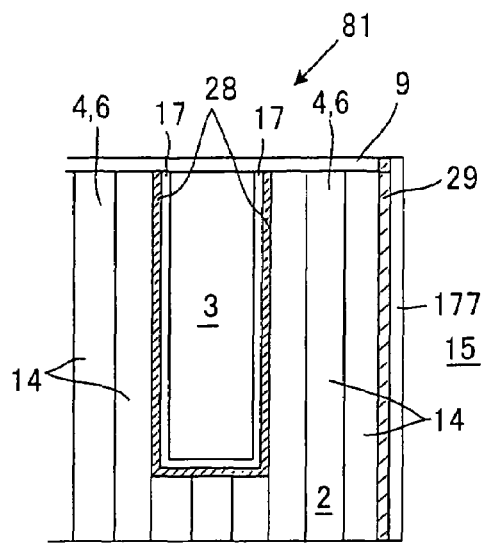
FIG. 8(a) is a sectional view showing a horizontally arranged-type piezoelectric/electrostrictive structure according to another embodiment of the present invention.
Figure 8B:
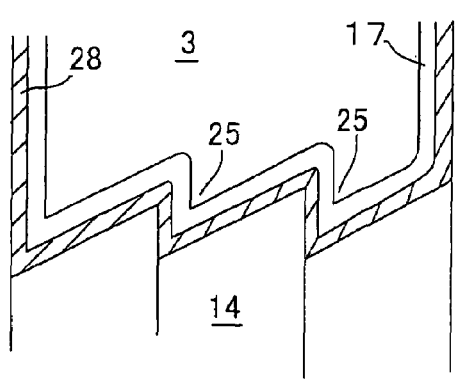
FIG. 8(b) is a partly enlarged view showing a side face of the piezoelectric/electrostrictive structure shown in FIG. 8(a), including a plurality of sheet-shaped piezoelectric/electrostrictive bodies, the interfaces between the piezoelectric/electrostrictive bodies being exposed at the side face.

FIG. 8(*a*) is a sectional view showing a horizontally arranged-type piezoelectric/electrostrictive structure 81 according to another embodiment of the present invention. FIG. 8(*b*) is a partly enlarged view showing a side face of the piezoelectric/electrostrictive structure 81, shown in FIG. 8(*a*), including a plurality of horizontally arranged sheet-shaped piezoelectric/electrostrictive bodies 14, the interfaces between the piezoelectric/electrostrictive bodies 14 being exposed at the side face. The piezoelectric/electrostrictive structure 81 includes partitions 6 which form piezoelectric/electrostrictive actuating parts 4 and in which the piezoelectric/electrostrictive bodies 14 are horizontally arranged. Cells 3 and dummy cells 15 are alternately arranged in the piezoelectric/electrostrictive structure 81 and are separated from each other with the partitions 6. First electrode films 28 functioning as common electrodes are each placed on corresponding faces of the partitions 6 that face the cells 3 and second electrode films 29 are each placed on corresponding faces of the partitions 6 that face the dummy cells 15. No electrode layers are placed between the piezoelectric/electrostrictive bodies 14. Protective films 17 may be each placed on the corresponding first electrode films 28 and insulating films 177 may be each placed on the corresponding second electrode films 29 as needed. The protective films 17 protect the first electrode films 28 from, for example, a corrosive liquid contained in the cells 3. The insulating films 177 insulate the second electrode films 29. A single-layered film having both a protective function and an insulating function may be used instead of the protective films 17 and the insulating films 177. The partitions 6 may have barrier films (not shown) placed under the first electrode films 28 or the second electrode films 29.

With reference to FIG. 8(*b*), in the piezoelectric/electrostrictive structure 81, the interfaces between the piezoelectric/electrostrictive bodies 14 are exposed at side faces of the partitions 6 that face the cells 3 and the side faces have a plurality of notches 25, which are not shown in FIG. 8(*a*), and are uneven due to the notches 25. The first electrode films 28 and protective films 17 placed on the notched portions of side faces in that order on the surface of piezoelectric/electrostrictive bodies have faces identical to the notched portions of side faces as shown in FIG. 8(*b*). The first electrode films 28 and the protective films 17 have a thickness less than the depth of the notches 25. Therefore, although the first electrode films 28 and protective films 17 cover the notches 25, the partitions 6 have no flat surfaces. This is characteristic of the piezoelectric/electrostrictive structure according to the present invention. Side faces of the partitions 6 that face the dummy cells 15 also have the notches 25 and are uneven. The second electrode films 29 and the insulating films 177 lie on these notched portions of side faces in that order on the surface of piezoelectric/electrostrictive bodies and have faces identical to the notched portions of side faces.

In the piezoelectric/electrostrictive structure 81, the piezoelectric/electrostrictive bodies 14 contain a piezoelectric material and are polarized, for example, in the direction from the first electrode films 28 to the second electrode films 29, that is, in the horizontal direction of FIG. 8(*a*). Electric fields of which the directions are the same as the polarization directions described above are created by applying voltages between the first electrode films 28 and the second electrode films 29 in such a manner that the first electrode films 28 are positively charged and the second electrode films 29 are negatively charged. In other words, in the piezoelectric/electrostrictive structure 81, the polarization directions are the same as those of the electric fields. Therefore, strains due to the electric fields are created in the piezoelectric/electrostrictive bodies 14, which are expanded or contracted in substantially the vertical direction as shown in FIG. 8(*a*), that is, expanded or contracted perpendicularly to the bottom plate 2. Hence, the piezoelectric/electrostrictive actuating parts 4 are driven due to the horizontal displacement. Since the displacement of the piezoelectric/electrostrictive bodies 14 is created directly using the strains due to the electric fields, the force created by the displacement is large and the response speed is high.

Figure 9:
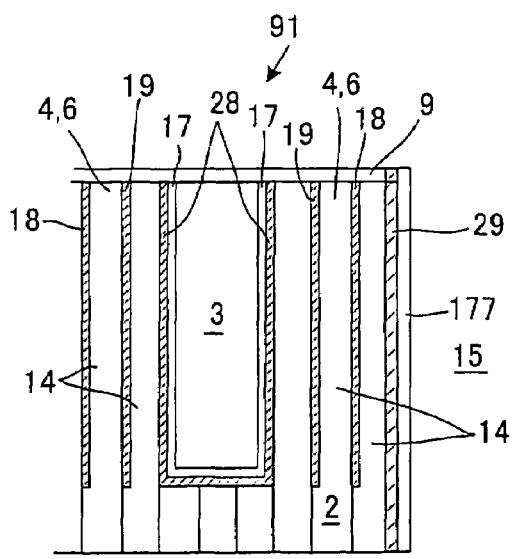
FIG. 9 is a sectional view showing a horizontally arranged-type piezoelectric/electrostrictive structure according to another embodiment of the present invention.

FIG. 9 is a sectional view showing a horizontally arranged-type piezoelectric/electrostrictive structure 91 according to another embodiment of the present invention. The piezoelectric/electrostrictive structure 91 is similar to the piezoelectric/electrostrictive structure 81 and includes partitions 6 which form piezoelectric/electrostrictive actuating parts 4 and in which a plurality of horizontally arranged sheet-shaped piezoelectric/electrostrictive bodies 14. Cells 3 and dummy cells 15 are alternately arranged in the piezoelectric/electrostrictive structure 91 and separated from each other by the partitions 6. First electrode films 28 are placed on side faces of the partitions 6 that face the cells 3 and second electrode films 29 are placed on side faces of the partitions 6 that face the dummy cells 15. First electrode layers 18 and second electrode layers 19 are each alternately placed between the piezoelectric/electrostrictive bodies 14. Since the cells 3 are to be filled with a conductive liquid, protective films 17 for protecting the first electrode films 28 are placed over the first electrode films 28. Insulating films 177 for insulating second electrode films 29 facing the dummy cells 15 are placed over the second electrode films 29. Barrier films (not shown) may be placed between the first electrode films 28 and faces of the partitions 6 that face the cells 3 or between the second electrode films 29 and faces of the partitions 6 that face the dummy cells 15. The piezoelectric/electrostrictive structure 91 has notches having a configuration identical to that of the notches 25 of the piezoelectric/electrostrictive structure 81 (see FIG. 8(b)).

In the piezoelectric/electrostrictive structure 91, the piezoelectric/electrostrictive bodies 14 contain a piezoelectric material and are polarized, for example, in the direction from the first electrode layers 18 to the second electrode layers 19, that is, in the horizontal direction of FIG. 9. The polarization directions of the piezoelectric/electrostrictive bodies 14 are different from each other depending on whether the piezoelectric/electrostrictive bodies 14 are placed on the left or right side of the first electrode layers 18. Common electrodes (not shown) for connecting the first electrode films 28 to the first electrode layers 18 and common electrodes (not shown) for connecting the second electrode films 29 to the second electrode layers 19 are arranged in the piezoelectric/electrostrictive structure 91. Electric fields of which the directions are the same as the polarization directions described above are created by applying voltages in such a manner that the first electrode films 28 and the first electrode layers 18 are positively charged and the second electrode films 29 and the second electrode layers 19 are negatively charged. In other words, in the piezoelectric/electrostrictive structure 91, the polarization directions are the same as those of the electric fields. Therefore, strains due to the electric fields are created in the piezoelectric/electrostrictive bodies 14, which are expanded or contracted in substantially the vertical direction as shown in FIG. 9; that is, expanded or contracted perpendicularly to the bottom plate 2. Hence, the piezoelectric/electrostrictive actuating parts 4 are driven due to the horizontal displacement. Since the displacement of the piezoelectric/electrostrictive bodies 14 is created directly using the strains due to the electric fields, the force created by the displacement is large and the response speed is high.

The above configurations are common to the configurations of the first and second piezoelectric/electrostrictive structures of the present invention. The thermal expansion coefficient of the piezoelectric/electrostrictive bodies of the second piezoelectric/electrostrictive structure and that of the insulating films thereof will now be described. Since the insulating films are included in the thin films, the piezoelectric/electrostrictive structures shown in FIGS. 5(a) to 9 are modifications of the second piezoelectric/electrostrictive structure.

A configuration of a piezoelectric/electrostrictive structure is illustrated below. This piezoelectric/electrostrictive structure includes a plurality of stacked sheet-shaped piezoelectric/electrostrictive bodies and the interfaces between the piezoelectric/electrostrictive bodies are exposed at side faces of the piezoelectric/electrostrictive structure. Thin films which have insulating properties only and which have a single-layered structure is placed on the side faces. The piezoelectric/electrostrictive structure 71 shown in FIG. 7(a) or 7(b) includes no insulating films but the protective films 17 having a single-layered structure and therefore has a configuration corresponding to that described above.

When a material for forming the piezoelectric/electrostrictive bodies is barium titanate ($BaTiO_3$) having a thermal expansion coefficient of $13 \times 10^{-6}$/K, the insulating films preferably contain tantalum oxide ($Ti_2O_5$) having a thermal expansion coefficient of $3.6 \times 10^{-6}$/K. The residual stresses in the insulating films act as compressive stresses due to the difference in thermal expansion coefficient.

Examples of a material for forming the insulating films include silicon dioxide ($SiO_2$) having a thermal expansion coefficient of $0.5 \times 10^{-6}$/K, aluminum oxide ($Al_2O_3$) having a thermal expansion coefficient of $8.0 \times 10^{-6}$/K, hafnium dioxide ($HfO_2$) having a thermal expansion coefficient of $6.3 \times 10^{-6}$/K, niobium oxide ($Nb_2O_5$) having a thermal expansion coefficient of $1.6 \times 10^{-6}$/K, yttrium oxide ($Y_2O_3$) having a thermal expansion coefficient of $7.9 \times 10^{-6}$/K, and zirconium dioxide ($ZrO_2$) having a thermal expansion coefficient of $6.9 \times 10^{-6}$/K in addition to $Ti_2O_5$. Such examples further include silicon nitride ($Si_3N_4$) having a thermal expansion coefficient of $2.7 \times 10^{-6}$/K, aluminum nitride (AlN) having a thermal expansion coefficient of $4.9 \times 10^{-6}$/K, and boron nitride (BN) having a thermal expansion coefficient of $3.9 \times 10^{-6}$/K in addition to the above oxides. Those oxides and nitrides may be used alone or in combination and a mixed crystal containing two or more of those oxides and nitrides may be used.

The reason for using such a mixed crystal is that the following ratio can be freely controlled: the ratio of a high-thermal expansion coefficient component (for example, magnesium oxide (MgO) having a thermal expansion coefficient of $13.4 \times 10^{-6}$/K) to a low-thermal expansion coefficient component (for example, silicon dioxide ($SiO_2$) having a thermal expansion coefficient of $0.5 \times 10^{-6}$/K). Therefore, the thermal expansion coefficient of mixed crystals can be designed. That is, the strength of piezoelectric/electrostrictive structures can be designed by selecting a material, having an appropriate thermal expansion coefficient, for forming a piezoelectric/electrostrictive body.

A configuration of a piezoelectric/electrostrictive structure is illustrated below. This piezoelectric/electrostrictive structure includes a plurality of stacked sheet-shaped piezoelectric/electrostrictive bodies and the interfaces between the piezoelectric/electrostrictive bodies are exposed at side faces of the piezoelectric/electrostrictive structure. The side faces have thin films placed thereon. The thin films include electrode films and insulating films lying over the electrode films and have a double-layered structure. This configuration is the same as those of the piezoelectric/electrostrictive structures 51, 61, 81, and 91 described above. When these thin films have such a double-layered structure, it is critical that the electrode films, the insulating films, and the piezoelectric/electrostrictive bodies be arranged in that order on the surface of piezoelectric/electrostrictive bodies and the insulating films have a thermal expansion coefficient less than that of the piezoelectric/electrostrictive bodies, which have a thermal expansion coefficient less than that of the electrode films or the piezoelectric/electrostrictive bodies have a thermal expansion coefficient less than that of the insulating films, which have a thermal expansion coefficient less than that of the electrode films. That is, it is critical that the electrode films have the largest thermal expansion coefficient. For the piezoelectric/electrostrictive structure designed have such a thermal expansion coefficient gradient, the residual stresses in the insulating films act as compressive stresses and the residual stresses in the piezoelectric/electrostrictive bodies act as compressive stresses. This allows the residual stresses in the electrode films to act as compressive stresses and also allows the residual stress in the piezoelectric/electrostrictive structure acts as a compressive stress. Hence, the piezoelectric/electrostrictive structure has high strength.

For example, the insulating films may contain tantalum oxide ($Ta_2O_5$) having a thermal expansion coefficient of $3.6 \times 10^{-6}$/K, the electrode films may contain copper (Cu) having a thermal expansion coefficient of $17 \times 10^{-6}$/K, and the piezoelectric/electrostrictive bodies may contain barium titanate ($BaTiO_3$) having a thermal expansion coefficient of $13 \times 10^{-6}$/K. When barrier films for covering the electrode films are used, the influence of the barrier films on those stresses is negligible because the barrier films have a small thickness. When the thin films include the insulating films only and the piezoelectric/electrostrictive bodies contain lead zirconate titanate with a relatively small thermal expansion coefficient, the thermal expansion coefficient of the thin films must be smaller and usable materials are limited. However, since the thin films have such a double-layered structure and the electrode films have the largest thermal expansion coefficient, the piezoelectric/electrostrictive structure has high strength even if the insulating films have a thermal expansion coefficient greater than that of the piezoelectric/electrostrictive bodies. Hence, various materials can be used. For example, the insulating films may contain aluminum oxide ($Al_2O_3$) having a thermal expansion coefficient of $8.0 \times 10^{-6}$/K, the electrode films may contain copper (Cu) having a thermal expansion coefficient of $17 \times 10^{-6}$/K, and the piezoelectric/electrostrictive bodies may lead zirconate titanate (PZT) having a thermal expansion coefficient of $3 \times 10^{-6}$/K. Alternatively, the electrode films may contain an oxide semiconductor other than metal. The electrode films may contain, for example, iridium oxide ($IrO_2$) having a thermal expansion coefficient of $5.8 \times 10^{-6}$/K or ruthenium oxide ($RuO_2$) having a thermal expansion coefficient of $6.4 \times 10^{-6}$/K. Since the electrode films containing such an oxide have a diffusion-preventing function, the piezoelectric/electrostrictive structure has high durability if the barrier films are omitted.

A method for manufacturing a piezoelectric/electrostrictive structure according to the present invention will now be described. FIGS. 10(*a*) to 10(*c*) show steps of the method. The following structure is used to describe the method: a piezoelectric/electrostrictive structure having the same configuration as that of the piezoelectric/electrostrictive structure 161 shown in FIG. 16(*a*) or 16(*b*).

A predetermined number of ceramic green sheets principally containing a piezoelectric material are first prepared. The ceramic green sheets can be prepared by a known process. For example, a powdery piezoelectric material is prepared and mixed with a binder, a solvent, a dispersant, a plasticizer, and another agent, whereby slurry having a desired composition is prepared. The slurry is degassed and then formed into the ceramic green sheets by a green sheet-forming process such as a doctor blade process or a reverse roll coating process.

The obtained ceramic green sheets are punched using, for example, a punch and a die, whereby a first green sheet 602, a plurality of second green sheets 615, and a third green sheet 619 are prepared as shown in FIG. 10(*a*). The second green sheets 615 have six first slits 605 for forming cells, seven second slits 625 for forming dummy cells, first circular holes 628 for forming via-holes for individual wires, and a second circular hole 629 for forming a via-hole for a common wire. The first green sheet 602 is used to prepare a bottom plate later and has the second slits 625. The third green sheet 619 is used to prepare a nozzle plate (for inkjet heads) later and has the second slits 625 and third circular holes 608 for forming nozzles. The first green sheet 602 and the third green sheet 619 may be prepared using another material other than the piezoelectric material.

As shown in FIG. 10(*b*), the first circular holes 628 and the second circular hole 629 are filled with a conductive material, whereby first via-holes 128 and a second via-hole 129 are prepared, respectively. First conductive films 318 containing a conductive material are formed on a half of the second green sheets 615 so as to be connected to the first via-holes 128 and second conductive films 319 containing a conductive material are each formed on the other corresponding half of the second green sheets 615 so as to be connected to the second via-holes 129, whereby fourth green sheets 614 and fifth green sheets 616 are prepared, respectively. These conductive films may be patterned by providing a photoresist on the films to subject the photoresist to exposure or by providing layers on the films to remove unnecessary portions of the layers by grinding or another technique.

In the fourth and fifth green sheets 614 and 616, the first slits 605 are longer than the second slits 625 and the first and second slits 605 and 625 are alternately arranged. Portions of the fourth and fifth green sheets 614 and 616 that extend between the first slits 605 and the second slits 625 are used to form partitions. The first conductive films 318 are connected to the individual wires and end portions of the first conductive films 318 are exposed from the first slits 605. The second conductive films 319 are connected to the common wire and end portions of the second conductive films 319 are exposed from the second slits 625. The first and second conductive films 318 and 319 can be formed so as to have a desired pattern by a screen printing process.

The fourth and fifth green sheets 614 and 616 are alternately stacked on the first green sheet 602 and then pressed, whereby a ceramic green compact with a predetermined thickness is prepared. The ceramic green compact is fired, whereby a sintered body (not shown) is prepared. The sintered body has six cells formed by the second slits 625 of the fourth and fifth green sheets 614 and 616 that are directly connected to each other and also has seven dummy cells 15 formed by the second slits 625 of the third, fourth, and fifth green sheets 602, 614, and 616 that are directly connected to each other. The third green sheet 619 is fired, whereby a nozzle plate 9 is prepared (see FIG. 10(*c*)).

Protective films are formed on faces of the sintered body that face the cells or the dummy cells by a chemical vapor deposition (CVD) process. External wires are connected to the sintered body and piezoelectric/electrostrictive portions of the sintered body are polarized, whereby a piezoelectric/electrostrictive structure 611 is prepared. The nozzle plate 9 is fixed to the piezoelectric/electrostrictive structure 611, whereby an inkjet head 601 is obtained (see FIG. 10(*c*)). Nozzles 8 and the dummy cells 15 are exposed at outer faces of the inkjet head 601 and the cells are arranged in the piezoelectric/electrostrictive structure 611 and are not therefore exposed at outer faces of the inkjet head 601.

In the method of the present invention, insulating films and/or moisture-proof films are formed by the CVD process in addition to the electrode films (conductive films) and the protective films. According to the CVD process, since gas flows between ceramic particles contained in the piezoelectric/electrostrictive portions, molecules in the gas are joined to the piezoelectric/electrostrictive portions, whereby these films are formed. Therefore, these films are dense and superior in coverage.

Examples of a process for forming these films include an electrophoretic process, an anodic oxidation process, a paste-coating process, a sputtering process, and a vapor deposition polymerization process in addition to the CVD process. For the electrophoretic process, a film is selectively formed in a solution using an electrochemical driving force and then fired. The resulting film is porous. For the anodic oxidation process, a film is formed in a solution by selectively oxidizing an anodic component and need not be fired. However, this process as well as the electrophoretic process is useless in forming dense films. In the method of the present invention, the above films are formed on the piezoelectric/electrostrictive structure, prepared by a green sheet-stacking process, having a multilayered structure. Since the green sheets each have tapered end faces, side faces of the piezoelectric/electrostrictive structure have notches, the interfaces between the fired sheets being exposed at the side faces. The notches have a width and depth on the order of 5 micron. In order to strengthen unbonded portions near the notches to enhance the strength of the piezoelectric/electrostrictive structure, the electrophoretic process and the anodic oxidation process cannot be used.

For the paste-coating process, paste is applied onto faces of a green compact including a plurality of ceramic green sheets, the interfaces between the ceramic green sheets being exposed at the faces, and then fired (see Japanese Patent Application No. 2002-334097 filed by the present applicant). In particular, the paste is prepared, applied onto the green compact faces having notches such that the notches and unbonded portions near the notches are covered with the paste, and then fired, whereby a sintered body having flat surfaces with no notches is obtained. Since the paste has surface tension, narrow spaces cannot be filled with the paste. Therefore, the paste-coating process is not suitable for the method, according to the present invention, for manufacturing a piezoelectric/electrostrictive structure having a high aspect ratio. Since such flat surfaces are obtained in the case of the paste-coating process, the process is not suitable for forming thin films on faces defined by the notches with retaining substantially the shapes defined by notches, which are characteristic of a piezoelectric/electrostrictive structure according to the present invention.

Figure 4:
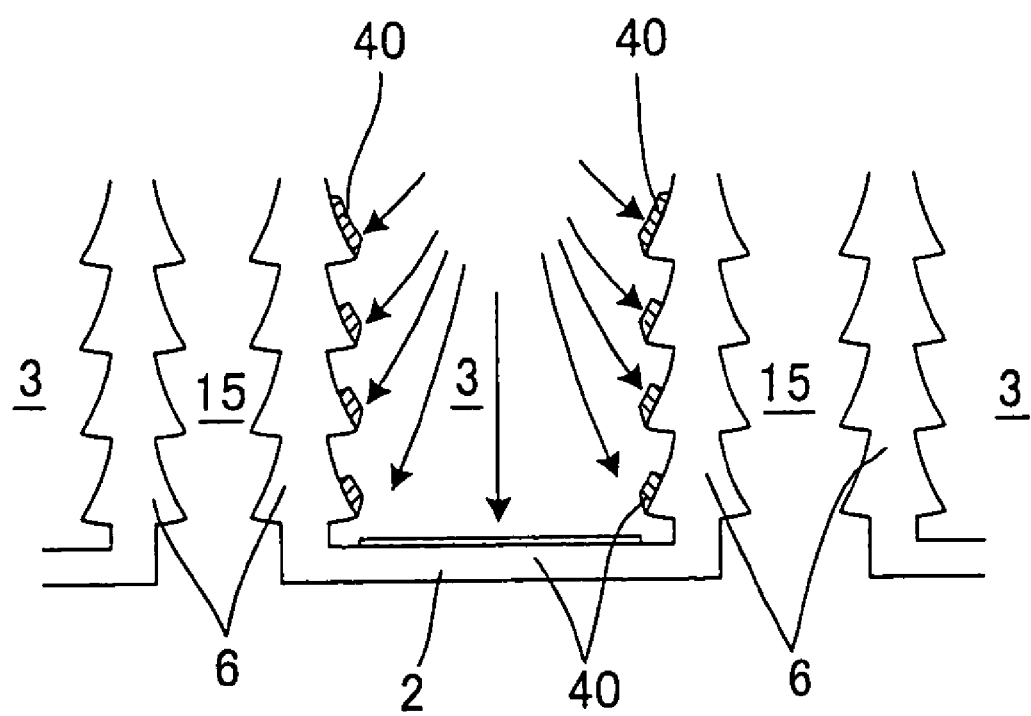
FIG. 4 is a sectional view showing a piezoelectric/electrostrictive structure which has notches shown in an enlarged manner and which includes films formed by a sputtering process.

For the sputtering process and a vapor deposition process such as a physical vapor deposition (PVD) process, the directivity is high. Therefore, these processes are useless in forming films on piezoelectric/electrostrictive structures with high a high aspect ratio. FIG. 4 is a sectional view showing a piezoelectric/electrostrictive structure which has notches shown in an enlarged manner and which includes films formed by the sputtering process. Although a film-forming material 40 is provided on side faces of partitions 6 which face cells 3 and which have notches before the cells 3 are covered with a nozzle plate, thin films cannot be formed on rear regions of the notches when viewed in the directions indicated by the arrows shown in FIG. 4. Therefore, the sputtering process is not useful for the method of the present invention. Even if the deposition angle is optimized or a collimate sputtering process is used, the formation of films on a piezoelectric/electrostrictive structure having an aspect ratio of about five or less is only possible if one wants to retain the shapes defined by notches.

In contrast, the vapor deposition polymerization process is suitable for the method of the present invention and can be used instead of the CVD process. For the vapor deposition polymerization process, different gaseous monomers having functional groups located both ends thereof are deposited on a substrate and then allowed to react with each other, whereby a polymeric thin film is formed on the substrate. For example, an organic thin film in which molecular chains are highly oriented can be prepared by this process. In particular, a polyimide film, a polyurea film, and the like can be prepared.

Figure 12:
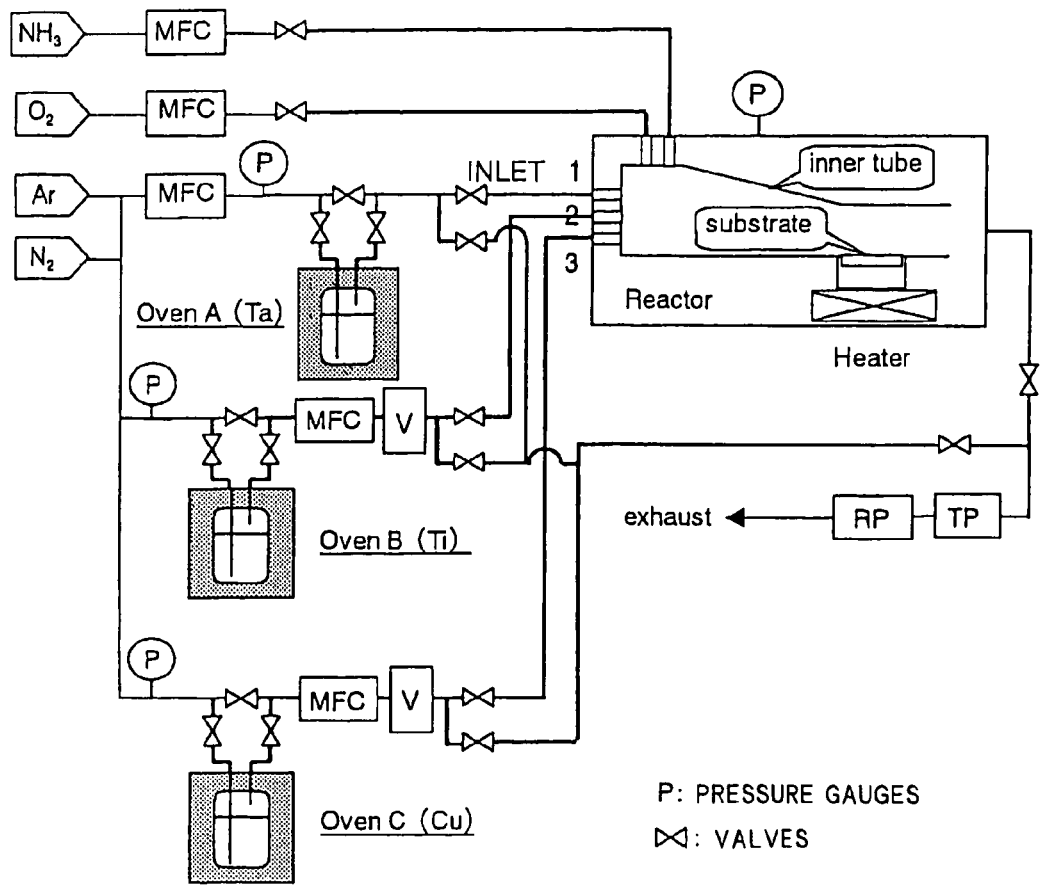
FIG. 12 is a schematic view showing a configuration of a metal-organic chemical vapor deposition system used in a chemical vapor deposition process.
Figure 13:
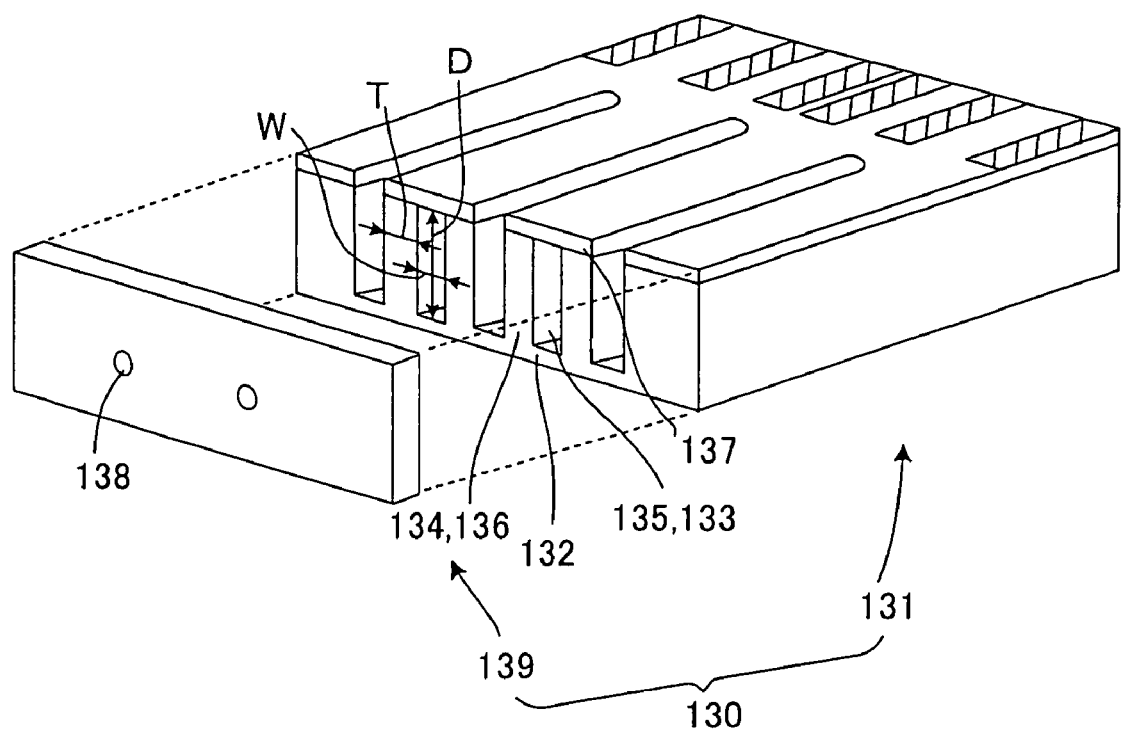
FIG. 13 is a perspective view showing an exemplary inkjet head.
Figure 14C:
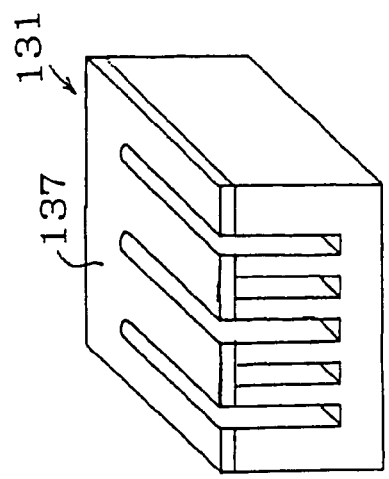
FIGS. 14(a) to 14(c) are illustrations showing steps of manufacturing an actuator.
Figure 14B:
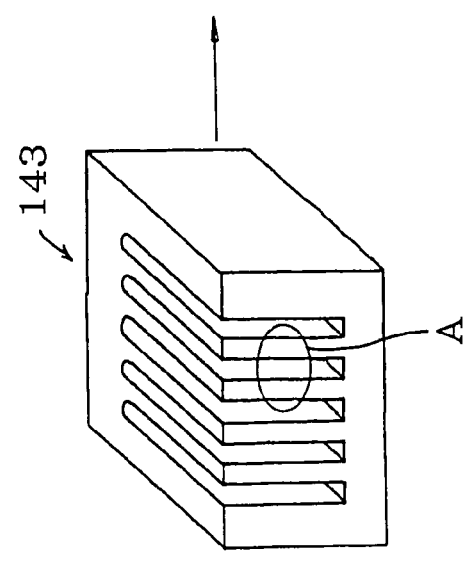
Figure 14A:
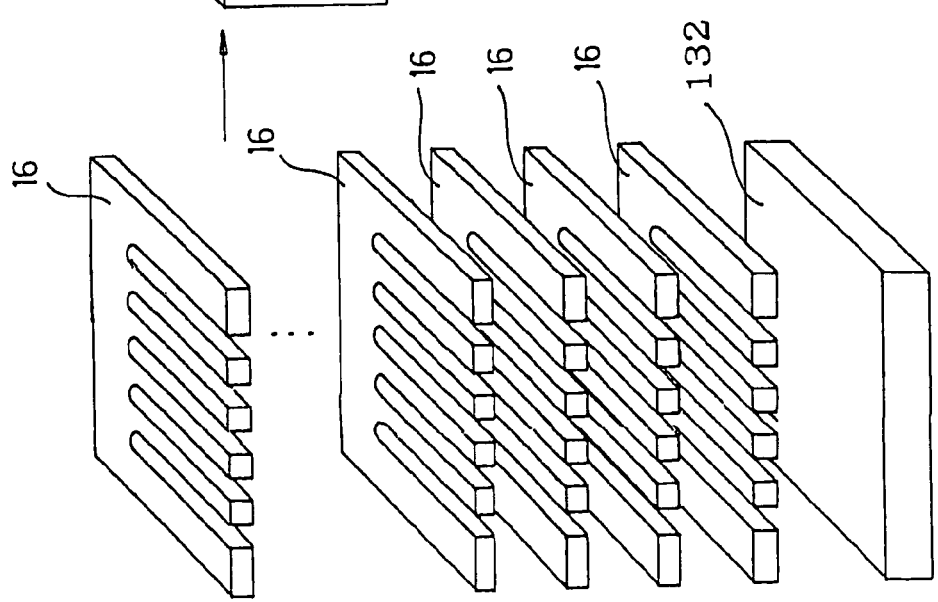

The CVD process will now be described with reference to materials (raw materials) used. FIG. 12 is a schematic view showing a configuration of a metal-organic chemical vapor deposition (MOCVD) system used in the CVD process. Carrier gases used are argon (Ar) and nitrogen ($N_2$) and oxygen ($O_2$) and reactive gases used are ammonia ($NH_3$). This system includes stainless vessels each containing corresponding raw materials for film formation; temperature-controllable first, second, and third ovens A, B, and C each connected to the corresponding stainless vessels; a quartz reactor having a double tube structure; a turbo-molecular pump; and a rotary pump. The reactor includes a horizontal inner tube in which a substrate is placed and also includes a heater for heating the substrate. Gas in the system is exhausted with the turbo-molecular pump and the rotary pump.

Procedures and conditions for forming the following films will now be described: an insulating film containing $Ta_2O_5$, a barrier film containing TiN, and an electrode film containing Cu. A Ta compound is stored in the first oven A, a Ti compound is stored in the second oven B, and a Cu compound stored in the third oven C. The first, second, and third ovens A, B, and C are separately connected to the reactor with different pipes. The Ta, Ti, Cu compounds are fed to the reactor through a first inlet 1, a second inlet 2, and a third inlet 3, respectively.

Formation of Insulating Film

Pentaethoxy tantalum ($Ta(OC_2H_5)_5$) is used to form the insulating film containing $Ta_2O_5$. In the MOCVD system, the Ta compound stored in the first oven A heated at 115° C. is introduced into the reactor together with an Ar carrier gas through the first inlet 1. A reactive gas used is $O_2$. The deposition temperature is 600° C., the deposition pressure is 1,300 Pa, the deposition time is two hours, and the thickness of the insulating film is 2 μm.

Formation of Barrier Film

Tetrakis(diethylamino) titanium ($Ti[N(C_2H_5)_2]_4$) is used to form the barrier film containing TiN. In the MOCVD system, the Ti compound stored in the second oven B is fed to the reactor through a mass flow controller (MFC) and a vaporizer heated at 100° C. A carrier gas used is $N_2$ and a reactive gas used is $NH_3$. The deposition temperature is 350° C., the deposition pressure is 10 Pa, the deposition time is five minutes, and the thickness of the barrier film is 50 nm. The barrier film may contain tantalum nitride (TaN), niobium nitride (NbN), or another nitride instead of TiN.

Formation of Electrode Film

Copper hexafluoroacetylacetonate trimethylvinylsilane is used to form the electrode film containing Cu. In the MOCVD system, the Cu compound stored in the third oven C is fed to the reactor through a MFC and a vaporizer. A carrier gas used is Ar. The deposition temperature is 210° C., the deposition pressure is 200 Pa, the deposition time is 20 minutes, and the thickness of the insulating film is 2 μm.

A parylene resin can be used to form a film by the CVD process other than the materials described above. If the parylene resin is used, such a film can be formed at room temperature. Since the parylene resin has superior insulating properties and high chemical resistance and is water-repellent, this resin can be used to form an insulating film, a protective film, and a moisture-proof film included in a piezoelectric/electrostrictive structure according to the present invention.

A piezoelectric/electrostrictive structure according to the present invention can be used for inkjet heads for printing apparatuses. Furthermore, the structure can be used for actuators for DNA microarrays, optical switches, micro-mirrors, and micromachine transport devices as disclosed in International Published Pamphlet No. WO 02/084751 filed by the present applicant. The structure can also be used for actuators for actuators for micropumps, coating apparatuses for manufacturing semiconductor devices, apparatuses for manufacturing complicated fine three-dimensional structures, and apparatuses for producing drugs.

What is claimed is:

1. A piezoelectric/electrostrictive structure comprising:
   a plurality of stacked sheet-shaped piezoelectric/electrostrictive bodies; and
   at least one sheet of a thin film;
   wherein interfaces between the stacked piezoelectric/electrostrictive bodies are exposed at side faces of the piezoelectric/electrostrictive structure, the side faces have a notched surface, and the at least one sheet of a thin film contacts the entire notched surface of the side faces.

2. The piezoelectric/electrostrictive structure according to claim 1, wherein the at least one sheet of a thin film has one of a single-layered and a multilayered structure, and includes at least one film selected from the group consisting of a barrier film, an electrode film, an insulating film, a protective film, and a moisture-proof film.

3. The piezoelectric/electrostrictive structure according to claim 2, wherein the barrier film is made of an oxide or a nitride, the electrode film is made of a metal or an oxide, and wherein the insulating film, the protective film and the moisture-proof film are made of an oxide, a nitride, or a carbide, individually.

4. The piezoelectric/electrostrictive structure according to claim 1, wherein the at least one sheet of a thin film further includes a barrier film and an electrode film which are placed in that order on each end face of the piezoelectric/electrostrictive bodies.

5. A piezoelectric/electrostrictive structure according to claim 1, wherein the at least one sheet of a thin film has one of a single-layered and a multilayered structure and includes at least one thin film selected from the group consisting of an insulating film, a protective film, and a moisture-proof film, and has a thermal expansion coefficient that is less than a thermal expansion coefficient of the piezoelectric/electrostrictive bodies.

6. The piezoelectric/electrostrictive structure according to claim 5, wherein the insulating film, the protective film, and the moisture-proof film are made of an oxide, a nitride, or a carbide, individually.

7. The piezoelectric/electrostrictive structure according to claim 5, wherein the thermal expansion coefficient of the thin films is 0.3 to 0.9 times the thermal expansion coefficient of the piezoelectric/electrostrictive bodies.

8. The piezoelectric/electrostrictive structure according to claim 5, wherein the at least one sheet of a thin film includes an electrode film placed on each end face of the piezoelectric/electrostrictive bodies and has at least one of an insulating film, a protective film, and a moisture-proof film placed on the electrode film.

9. The piezoelectric/electrostrictive structure according to claim 8, wherein the at least one sheet of a thin film includes a barrier film placed on each end face of the piezoelectric/electrostrictive bodies, and has an electrode film having been placed on the barrier film.

10. The piezoelectric/electrostrictive structure according claim 9, further comprising electrode layers each placed between respective sheets of the piezoelectric/electrostrictive bodies.

11. The piezoelectric/electrostrictive structure according to claim 1, wherein notches of the notched surface have substantially a triangular shape in cross section.

12. The piezoelectric/electrostrictive structure according to claim 11, wherein the notches have a width of 300 µm or less.

13. The piezoelectric/electrostrictive structure according to claim 12, wherein the notches have a depth of 3 to 50 µm.

14. The piezoelectric/electrostrictive structure according to claim 13, wherein the aspect ratio thereof is five to 100.

15. A piezoelectric/electrostrictive actuator, comprising:
    a plurality of cells each defined by a cover plate, a bottom plate, and a pair of partitions connected to the cover plate and the bottom plate;
    wherein the partitions each comprise a plurality of stacked sheet-shaped piezoelectric/electrostrictive bodies and at least one sheet of a thin film, wherein interfaces between the stacked piezoelectric/electrostrictive bodies are exposed at side faces of the piezoelectric/electrostrictive structure, the side faces have notches, and the at least one sheet of a thin film is placed on the notched potions of side faces and the cells can change its volume due to displacement of the piezoelectric/electrostrictive structure.

16. A piezoelectric/electrostrictive structure comprising:
    a plurality of stacked sheet-shaped piezoelectric/electrostrictive bodies; and
    at least one sheet of a thin film;
    wherein interfaces between the stacked piezoelectric/electrostrictive bodies are exposed at side faces of the piezoelectric/electrostrictive structure, the side faces have notches, and the at least one sheet of a thin film contacts bottom surfaces of the notches on at least one of the side faces of the piezoelectric/electrostrictive structure.

* * * * *